(12) United States Patent
Ogihara et al.

(10) Patent No.: US 9,377,690 B2
(45) Date of Patent: Jun. 28, 2016

(54) COMPOSITON FOR FORMING METAL OXIDE-CONTAINING FILM AND PATTERNING PROCESS

(71) Applicant: SHIN-ETSU CHEMICAL CO., LTD., Tokyo (JP)

(72) Inventors: Tsutomu Ogihara, Jyoetsu (JP); Takafumi Ueda, Jyoetsu (JP); Seiichiro Tachibana, Jyoetsu (JP); Yoshinori Taneda, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/107,500

(22) Filed: Dec. 16, 2013

(65) Prior Publication Data

US 2014/0193757 A1    Jul. 10, 2014

(30) Foreign Application Priority Data

Jan. 8, 2013   (JP) ................. 2013-001251

(51) Int. Cl.
   *G03C 1/77*    (2006.01)
   *G03F 7/09*    (2006.01)
   *G03F 7/075*   (2006.01)

(52) U.S. Cl.
   CPC .............. *G03F 7/094* (2013.01); *G03F 7/0752* (2013.01)

(58) Field of Classification Search
   USPC ................... 430/275.1; 106/287.17
   See application file for complete search history.

(56) References Cited

U.S. PATENT DOCUMENTS

| | | | |
|---|---|---|---|
| 4,510,136 A | 4/1985 | Moberg | |
| 4,902,603 A | 2/1990 | Slater et al. | |
| 5,178,989 A | 1/1993 | Heller et al. | |
| 5,508,358 A | 4/1996 | Ono et al. | |
| 5,632,910 A | 5/1997 | Nagayama et al. | |
| 7,651,829 B2 | 1/2010 | Hamada et al. | |
| 8,501,386 B2 | 8/2013 | Ogihara et al. | |
| 8,715,913 B2 | 5/2014 | Ogihara et al. | |
| 8,759,220 B1 | 6/2014 | Ogihara et al. | |
| 8,932,953 B2 | 1/2015 | Ogihara et al. | |
| 8,945,820 B2 | 2/2015 | Ogihara et al. | |
| 8,951,917 B2 | 2/2015 | Ogihara et al. | |
| 2001/0016635 A1 | 8/2001 | Evain et al. | |
| 2002/0187422 A1 | 12/2002 | Angelopoulos et al. | |
| 2003/0191268 A1 | 10/2003 | Iwasawa et al. | |
| 2003/0235786 A1 | 12/2003 | Krishnamurthy et al. | |
| 2004/0058275 A1 | 3/2004 | Neef et al. | |
| 2004/0241579 A1 | 12/2004 | Hamada et al. | |
| 2005/0048395 A1 | 3/2005 | Kobayashi et al. | |
| 2005/0112383 A1 | 5/2005 | Tanaka et al. | |
| 2006/0019195 A1 | 1/2006 | Hatakeyama et al. | |
| 2006/0024980 A1 | 2/2006 | Tsuchiya et al. | |
| 2006/0040206 A1 | 2/2006 | Nakashima et al. | |
| 2006/0141693 A1 | 6/2006 | Hagiwara et al. | |
| 2007/0134916 A1 | 6/2007 | Iwabuchi et al. | |
| 2007/0178318 A1 | 8/2007 | Tanaka et al. | |
| 2007/0203275 A1 | 8/2007 | Kikuchi et al. | |
| 2007/0231738 A1 | 10/2007 | Kaneko et al. | |
| 2007/0238300 A1 | 10/2007 | Ogihara et al. | |
| 2008/0026322 A1 | 1/2008 | Ogihara et al. | |
| 2009/0011366 A1 | 1/2009 | Tsubaki et al. | |
| 2009/0136869 A1 | 5/2009 | Ogihara et al. | |
| 2010/0036012 A1 | 2/2010 | Kimura et al. | |
| 2010/0040972 A1 | 2/2010 | Tarutani et al. | |
| 2010/0041805 A1 | 2/2010 | Amidaiji et al. | |
| 2010/0086872 A1 | 4/2010 | Ogihara et al. | |
| 2012/0276483 A1 | 11/2012 | Ogihara et al. | |
| 2013/0005150 A1 | 1/2013 | Ogihara et al. | |
| 2013/0045601 A1 | 2/2013 | Ogihara et al. | |
| 2013/0101942 A1 | 4/2013 | Tanaka et al. | |
| 2014/0342289 A1 | 11/2014 | Ogihara et al. | |

FOREIGN PATENT DOCUMENTS

| | | |
|---|---|---|
| EP | 1 628 160 A2 | 2/2006 |
| EP | 1 845 132 A2 | 10/2007 |
| EP | 2 103 655 | 9/2009 |

(Continued)

OTHER PUBLICATIONS

U.S. Appl. No. 14/107,841, filed Dec. 16, 2013 in the name of Ogihara et al.

Maenhoudt et al., "Double Patterning scheme for sub-0.25 k1 single damascene structures at NA=0.75, λ=-193nm", *Proceedings of SPIE*, 2005, pp. 1508-1518, vol. 5754.

Nakamura et al., "Contact Hole Formation by Multiple Exposure Technique in Ultra-low $k_1$ Lithography", *Proceedings of SPIE*, 2004, pp. 255-263, vol. 5377.

Oct. 9, 2012 Extended European Search Report issued in European Patent Application No. 12004626.3.

(Continued)

*Primary Examiner* — Daborah Chacko Davis
(74) *Attorney, Agent, or Firm* — Oliff PLC

(57) ABSTRACT

The invention provides a composition for forming a metal oxide-containing film comprising, as a component (A), a metal oxide-containing compound $A_1$ obtained by hydrolysis and/or condensation of one or more kinds of hydrolysable metal compounds shown by the following general formula (A-1), as a component (B), an aromatic compound shown by the following general formula (B-1), the compound generating a hydroxyl group by thermal and/or an acid. There can be provided a composition for a resist lower layer film, which has high etching selectivity, capable of subjecting to stripping under mild conditions than the conventional process, has excellent pattern adhesiveness, and fine pattern formation can be performed.

$$L(OR^{0A})_{a0}(OR^{1A})_{a1}(O)_{a2} \qquad \text{(A-1)}$$

$$(D^1)_{d1}[(E{-}D^2)_{d2}{-}G{-}D^3]_{d3} \qquad \text{(B-1)}$$

20 Claims, No Drawings

(56) References Cited

FOREIGN PATENT DOCUMENTS

| EP | 2 138 898 A1 | 12/2009 |
|---|---|---|
| EP | 1 798 599 A1 | 4/2010 |
| EP | 2 172 808 A1 | 4/2010 |
| EP | 2 500 775 A2 | 9/2012 |
| EP | 2 518 562 A2 | 10/2012 |
| EP | 2 540 780 A1 | 1/2013 |
| JP | A-7-181688 | 7/1995 |
| JP | A-7-183194 | 7/1995 |
| JP | A-11-258813 | 9/1999 |
| JP | H11-258813 A | 9/1999 |
| JP | A-2000-53921 | 2/2000 |
| JP | A-2004-153125 | 5/2004 |
| JP | 2004-179391 A | 6/2004 |
| JP | A-2005-128509 | 5/2005 |
| JP | A-2005-173552 | 6/2005 |
| JP | A-2005-520354 | 7/2005 |
| JP | A-2005-537502 | 12/2005 |
| JP | A-2006-508377 | 3/2006 |
| JP | A-2006-251369 | 9/2006 |
| JP | A-2006-317864 | 11/2006 |
| JP | A-2007-199653 | 8/2007 |
| JP | A-2007-226170 | 9/2007 |
| JP | A-2007-297590 | 11/2007 |
| JP | A-2007-302873 | 11/2007 |
| JP | A-2008-281974 | 11/2008 |
| JP | A-2008-281980 | 11/2008 |
| JP | 2009-025707 A | 2/2009 |
| JP | A-2009-053657 | 3/2009 |
| JP | A-2009-126940 | 6/2009 |
| JP | A-2010-085893 | 4/2010 |
| JP | B2-4716037 | 7/2011 |
| JP | 2013-083964 A | 5/2013 |
| TW | 2008-06746 | 2/2008 |
| TW | 201300958 A1 | 1/2013 |
| WO | WO 2004/007192 A1 | 1/2004 |
| WO | WO 2011/105368 A1 | 9/2011 |

OTHER PUBLICATIONS

Jul. 23, 2014 Office Action issued in European Patent Application No. 12 004 626.3.
Aug. 19, 2014 Notification of Reasons for Refusal issued in Japanese Patent Application No. 2011-220708 (with partial translation).
Database Reaxys [Online], Sumitomo Chemical Company, Limited, "Organic Silicon-Based Compound and Method of Producing the Same," Aug. 30, 2007, XP002698567.
Temtsin et al., "Aromatic PMOs: tolyl, xylyl and dimethoxyphenyl groups integrated within the channel walls of hexagonal mesoporous silicas," *Journal of Materials Chemistry*, vol. 11, No. 12, Oct. 23, 2001, pp. 3202-3206.
Database Reaxys [Online], Manoso et al., "Improved Synthesis of Aryltrialkoxysilanes via Treatment of Aryl Grignard or Lithium Reagents with Tetraalkyl Orthosilicates," 2004, XP002698568.
Database Reaxys [Online], Seganish et al., "Efforts Directed toward the Synthesis of Colchicine: Application of Palladium-Catalyzed Siloxane Cross-Coupling Methodology," 2005, XP002698569.
Database CA [Online], Virtanen et al., "Organosilane and their hydrolytic polymers as surface treatment agents for use in chromatography and electronics," 1987, XP002698571.
Database CA [Online], Harkonen et al., "External silane donors in Ziegler-Natta catalysis. An approach to the optimum structure of the donor," 1992, XP002698572.
Database CA [Online], O'Dell, R., "A convenient synthesis of arylbis (ethyltrifluorosiliconate)s," 1995, XP002698573.
Jun. 24, 2013 Extended Search Report issued in European Application No. 13002020.9.
Oct. 9, 2014 Office Action issued in European Patent Application No. 13002020.9-1451.
Patai, S. et al., "The Chemistry of Organic Silicon Compounds," 1989, John Wiley & Sons, pp. 909-916.
Aug. 12, 2013 Extended Search Report issued in European Application No. 12002878.2.
Jan. 20, 2014 Taiwanese Office Action issued in Taiwanese Patent Application No. 101115187 (with partial English-language translation).
Jun. 19, 2013 Extended European Search Report issued in European Patent Application No. EP. 13 00 0600.0.
May 20, 2014 Office Action issued in Japanese Patent Application No. 2012-029230 (with partial translation).
Jun. 13, 2013 European Search Report issued in European Patent Application No. EP 13000599.4.
Mar. 17, 2014 Office Action issued in U.S. Appl. No. 13/524,669.
Jul. 9, 2014 Final Rejection issued in U.S. Appl. No. 13/524,669.
Oct. 21, 2014 Office Action issued in U.S. Appl. No. 13/854,622.
Feb. 10, 2014 Office Action issued in U.S. Appl. No. 13/430,319.
Jul. 17, 2013 Office Action issued in U.S. Appl. No. 13/430,319.
Sep. 4, 2014 Office Action issued in U.S. Appl. No. 13/747,125.
Aug. 29, 2014 Office Action issued in U.S. Appl. No. 13/747,154.
U.S. Appl. No. 14/107,841 in the name of Ogihara et al., filed Dec. 16, 2013.
U.S. Appl. No. 13/747,154 in the name of Ogihara et al., filed Jan. 22, 2013.
U.S. Appl. No. 13/854,622 in the name of Ogihara et al., filed Apr. 1, 2013.
U.S. Appl. No. 13/430,319 in the name of Ogihara et al., filed Mar. 26, 2012.
May 12, 2015 Office Action issued in Japanese Patent Application No. 2013-001341.
May 20, 2015 Office Action issued in U.S. Appl. No. 14/107,841.
Feb. 12, 2015 Office Action issued in Taiwanese Patent Application No. 103100403.
Jul. 7, 2015 Office Action issued in Taiwanese Patent Application No. 103100403.
Mar. 27, 2015 Office Action issued in European Application No. 13000599.4.
Dec. 24, 2014 Office Action issued in Japanese Patent Application No. 2012-029230.
Oct. 30, 2015 Office Action issued in U.S. Appl. No. 14/107,841.
Jan. 6, 2015 Office Action issued in Japanese Patent Application No. 2012-029228.

// # COMPOSITION FOR FORMING METAL OXIDE-CONTAINING FILM AND PATTERNING PROCESS

BACKGROUND OF THE INVENTION

1. Field of the Invention

The present invention relates to a composition for forming a metal oxide-containing film to be used for a multilayer resist method which is used for fine processing in the manufacturing step such as a semiconductor device, etc., and a patterning process using the same.

2. Description of the Related Art

As an exposure light to be used for formation of a resist pattern, light exposure using a g-beam (436 nm) or an i-beam (365 nm) of a mercury lamp has widely been used in 1980's. As a means for further miniaturization, a method of shifting to a shorter wavelength of exposure light has been considered to be effective, so that in a mass-production process after a DRAM (dynamic random access memory) with 64 MB (processing dimension is 0.25 μm or less) in 1990's, a KrF excimer laser (248 nm) at a shorter wavelength was used as an exposure light source instead of the i-beam (365 nm). However, in production of DRAMs at integration degrees of 256 MB and 1 GB or higher which require a finer processing technique (processing dimension is 0.2 μm or less), light sources at a shorter wavelength were required, thereby a photolithography using an ArF excimer laser (193 nm) has been earnestly investigated in the past ten years. At first, the ArF lithography was intended to be firstly applied to a device fabrication of a 180 nm node device, but the KrF excimer lithography was prolonged in life to a mass-production of a 130 nm node device, so that the ArF lithography was firstly and fully applied to a 90 nm node. Further, such a technique was combined with a lens having an NA increased to 0.9, thereby conducting a mass-production of a 65 nm node device. For the next 45 nm node device, further shortening of a wavelength of the exposure light was progressing, and the $F_2$ lithography with a wavelength of 157 nm was considered to be a candidate. However, development of the $F_2$ lithography has stopped due to various problems such as an increased cost of a scanner since an expensive $CaF_2$ single crystal is used for a projection lens with a large amount, an optical system shall be changed accompanying with introduction of a hard pellicle instead of a soft pellicle having extremely low durability, etching resistance of the resist film is lowered, etc., whereby an ArF liquid immersion lithography has been introduced.

In the ArF liquid immersion lithography, such water having a refractive index of 1.44 was introduced between a projection lens and a wafer by a partial filling manner, thereby enabling a high-speed scanning to conduct mass-production of a 45 nm node device by means of a lens having an NA of about 1.3.

As a candidate of lithography technique for a 32 nm node, vacuum ultraviolet light (EUV) lithography with a wavelength of 13.5 nm has been mentioned. As problems of the EUV lithography, there may be mentioned a laser to be increased in output, a resist film to be increased in higher sensitivity, a resolution to be enhanced, a line edge roughness (LER) to be lowered, an MoSi laminated mask to be free of defects, reflective mirror aberrations to be lowered, etc., whereby the problems to be overcome are piled up. The development of the high refractive index liquid immersion lithography which is another candidate as a technique for a 32 nm node has stopped since a transmittance of the LUAG which is a candidate of a high refractive index lens exhibits a lower transmittance, and it has been impossible to obtain a liquid having a refractive index increased to a targeted value of 1.8. Thus, in the light exposure used as a general-purpose technique, it is approaching the essential limit of the resolution derived from the wavelength of the light sources.

Thus, as one of the miniaturization techniques attracted attention in recent years, there is a double patterning process which forms a pattern by the first time exposure and development, and forms a pattern by the second time exposure at just between the patterns of the first time (Non-Patent Document 1). As the method of the double patterning, many processes have been proposed. For example, it may be mentioned a method in which a photoresist pattern with a distance of the line and the space of 1:3 is formed by the first time exposure and development, the hard mask of the under layer is processed by the dry etching, a hard mask is further provided thereon with another layer, a line pattern is formed at the first time exposure space portion by exposure and development of the photoresist film, the hard mask is processed by dry etching to form a line and space pattern with a half pitch of the initial pattern. Also, a photoresist pattern with a distance of the line and the space of 1:3 is formed by the first time exposure and development, a hard mask which is an under layer is processed by dry etching, a photoresist film is coated thereon, a space pattern of the second time is exposed to the portion at which the hard mask is remained, and the hard mask is processed by dry etching. Here, in the former method, the hard mask must be prepared twice, while in the latter method, formation of the hard mask is performed once, but a trench pattern shall be formed, which is difficult to resolve as compared with the line pattern. Also, in both of the methods, the procedures for processing the hard mask by dry etching are performed twice.

As the other miniaturization techniques, there has been proposed a method in which a line pattern in the X-direction is formed on the positive type resist film using a dipole illumination, the resist pattern is cured, a resist material is again coated thereon, a line pattern in the Y-direction is exposed by a dipole illumination, whereby a hole pattern is formed from gaps of the latticed line pattern (Non-Patent Document 2).

As one of the methods for transferring a lithography pattern to a substrate by utilizing the hard mask, there is a multilayer resist method. The multilayer resist method comprises interposing an underlayer film, e.g., a silicon-containing resist lower layer film, having different etching selectivity from that of a photoresist film, i.e., a resist upper layer film between the resist upper layer film and a substrate to be processed, after obtaining a pattern onto the resist upper layer film, the pattern thus obtained is transferred onto the resist lower layer film using the resist upper layer pattern as an etching mask, and further, the pattern thus obtained is transferred onto the substrate to be processed using the resist lower layer film as an etching mask.

As a composition of an underlayer film to be used in the multilayer resist method, a composition for forming a silicon-containing film has been well known. For example, there are a silicon-containing inorganic film, a $SiO_2$ film (Patent Document 1) or a SiON film (Patent Document 2, etc.) by CVD, and as a material which can be obtained a film by spin coating, there are a SOG (spin on glass) film (Patent Document 3) and a cross-linking silsesquioxane film (Patent Document 4), etc.

Until now, lithographic characteristics or stability of a composition for forming a silicon-containing resist lower layer film has been investigated, and Patent Document 5 discloses that a resist lower layer film in which both of etching selectivity and storage stability are good can be provided by preparing a composition for forming an resist lower layer film containing a heat crosslinking accelerator. However, by further progressing miniaturization of the semiconductor apparatus, not only the line width of the pattern becomes fine, but also a film thickness of the resist upper layer film becomes thin to prevent from collapse of the pattern, so that improvement in adhesiveness and improvement in etching selectivity of the fine pattern have been demanded than the conventional materials in the performances required for the resist lower layer film.

Most of a coating films practically used in the conventional multilayer resist method is an organic film or the above-mentioned silicon-containing film. However, in the semiconductor apparatus manufacturing process at the marginal domain of the lithography in recent years, complex process such as the above-mentioned double patterning, etc., have been proposed, and it becomes difficult to construct reasonable manufacturing process only by the conventional organic film and the silicon-containing film. Thus, for the purpose of constructing more reasonable semiconductor apparatus manufacturing process, it has been required to develop a coating film which is not only having etching selectivity to both of the film components of the organic film and the silicon-containing film, but also is capable of stripping under mild conditions without damaging the substrate to be processed after showing an etching mask function which is one of the functions of the underlayer film, i.e., after etching processing step of the substrate to be processed.

PRIOR ART REFERENCES

Patent Documents

Patent Document 1: Japanese Patent Laid-Open Publication No. 7-183194A
Patent Document 2: Japanese Patent Laid-Open Publication No. 7-181688A
Patent Document 3: Japanese Patent Laid-Open Publication No. 2007-302873
Patent Document 4: Japanese Patent Laid-Open Publication No. 2005-520354
Patent Document 5: Japanese Patent No. 4716037
Patent Document 6: Japanese Patent Laid-Open Publication No. 11-258813
Patent Document 7: Japanese Patent Laid-Open Publication No. 2006-251369
Patent Document 8: Japanese Patent Application Publication No. 2005-537502
Patent Document 9: Japanese Patent Laid-Open Publication No. 2005-173552
Patent Document 10: Japanese Patent Laid-Open Publication No. 2006-317864
Patent Document 11: Japanese Patent Application Publication No. 2006-508377

Non-Patent Documents

Non-Patent Document 1: Proc. SPIE Vol. 5754 p. 1508 (2005)
Non-Patent Document 2: Proc. SPIE Vol. 5377 p. 255 (2004)

SUMMARY OF THE INVENTION

Under such a circumstance, resist lower layer films containing various kinds of metal have been proposed. Among these, as a coating film which can be expected to have the above-mentioned etching selectivity and delaminating property, there is a titanium-containing coating film (Patent Document 6 to 11). For example, in Patent Document 6, a process using polytitanoxane has been described in the description thereof, but with regard to stripping of a coating film, dry stripping alone is described and wet stripping is never referred to. In Patent Document 7, with regard to stripping of the coating film, there have been exemplified by dry stripping and wet stripping using 1% hydrofluoric acid, but when a circuit, etc., has been formed on the substrate, there is a possibility that the circuit on the substrate is damaged by the hydrofluoric acid so that this is not practically usable method. In Patent Document 8, wet stripping by using a tetramethyl ammonium hydroxide developing solution or potassium hydroxide has been proposed. In Patent Document 9 and Patent Document 10, wet stripping with an acid or an alkali which is similar to the resist stripping solution has been proposed. On the other hand, in Patent Document 11, evaluation of patterning by i-beam exposure has been confirmed by incorporating a specific light absorbing agent, but patterning by an ArF exposure which has now been applied to the forefront process has never been evaluated. Accordingly, a composition for a resist lower layer film which has high etching selectivity to an organic film material and a silicon-containing film material, can be striped under mild conditions and can form a fine pattern has been demanded.

The present invention has been accomplished in view of the above-mentioned problems, and an object thereof is to provide a composition for forming a metal oxide-containing film for an resist lower layer film, having high etching selectivity, capable of subjecting to stripping under mild conditions than the conventional process, excellent in pattern adhesiveness, and can form a fine pattern.

To solve the above-mentioned problems, the present invention is to provide a composition for forming a metal oxide-containing film comprising:

as a component (A), a metal oxide-containing compound $A_1$ obtained by hydrolysis and/or condensation of one or more kinds of hydrolysable metal compounds shown by the following general formula (A-1), $$L(OR^{0A})_{a0}(OR^{1A})_{a1}(O)_{a2} \qquad (A\text{-}1)$$

wherein, $R^{0A}$ and $R^{1A}$ represent an organic group having 1 to 30 carbon atoms; a0, a1 and a2 represent an integer of 0 or more and $a0+a1+2 \times a2$ is the same number as the number determined by valency of L; and L is any of aluminum, gallium, yttrium, titanium, zirconium, hafnium, bismuth, tin, vanadium, and tantalum, as a component (B), an aromatic compound shown by the following general formula (B-1), the compound generating a hydroxyl group by thermal and/or an acid,

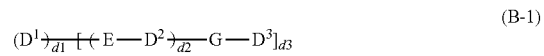

(B-1)

wherein, d1 and d3 represent an integer of 1, 2 or 3; d2 represents an integer of 0, 1 or 2; E and G represent a single bond or a divalent organic group composed of one or more of carbon, oxygen and hydrogen atom; and each $D^1$, $D^2$ and $D^3$ may be the same or different and represents an organic group shown by the following general formula (B-1a) or (B-1b),

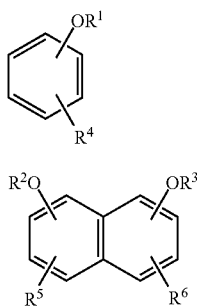

(B-1a)

(B-1b)

wherein, each $R^1$, $R^2$ and $R^3$ may be the same or different and represents an organic group shown by the following general formula (B-1c), (B-1d) or (B-1e); and each $R^4$, $R^5$ and $R^6$ may be the same or different and represents a hydrogen atom or an alkyl group having 1 to 20 carbon atoms, and two alkyl groups may be bonded to form a cyclic substituent,

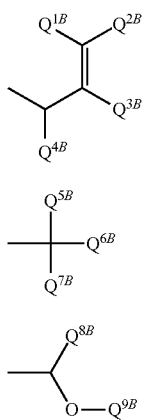

(B-1c)

(B-1d)

(B-1e)

wherein, $Q^{1B}$ to $Q^{4B}$ represent a hydrogen atom or an alkyl group having 1 to 20 carbon atoms, and two substituents arbitrarily selected from $Q^{1B}$ to $Q^{4B}$ may be bonded to form a cyclic substituent; $Q^{5B}$ to $Q^{7B}$ represent an alkyl group having 1 to 20 carbon atoms, and two substituents arbitrarily selected from $Q^{5B}$ to $Q^{7B}$ may be bonded to form a cyclic substituent; and $Q^{8B}$ and $Q^{9B}$ represent an alkyl group having 1 to 20 carbon atoms, and $Q^{8B}$ and $Q^{9B}$ may be bonded each other to form a cyclic substituent.

When such a composition for forming a metal oxide-containing film is used as the resist lower layer film, the film has high etching selectivity, can be striped under mild conditions than the conventional process, has excellent pattern adhesiveness, and can form a fine pattern.

Also, component (A) preferably contains a metal oxide-containing compound $A_2$ obtained by hydrolysis and/or condensation of one or more kinds of hydrolysable metal compounds shown by the above general formula (A-1) and one or more kinds of hydrolysable metal compounds shown by the following general formula (A-2):

$$M(OR^{3A})_{a3}OR^{4A})_{a4}(O)_{a5} \quad (A-2)$$

wherein, $R^{3A}$ and $R^{4A}$ represent an organic group having 1 to 10 carbon atoms; a3, a4 and a5 represent an integer of 0 or more, and a3+a4+2×a5 is the same number as the number determined by valency of M; and the M is an element belonging to groups of III, IV, or V in a periodic table except for carbon and is an element different from L.

Also, the component (A) is preferably a mixture of the above-mentioned metal oxide-containing compound $A_1$ and the above-mentioned metal oxide-containing compound $A_2$.

Also, the component (A) is preferably a mixture of the metal oxide-containing compound $A_1$ and a metal oxide-containing compound $A_3$ obtained by hydrolysis and/or condensation of one or more kinds of hydrolysable metal compounds shown by the general formula (A-2).

When these components (A) are used, they can be used as a resist lower layer film, which has higher etching selectivity, and stripping thereof can be performed under milder conditions.

Further, the composition for forming a metal oxide-containing film preferably further comprises, as a component (C), a silicon-containing compound obtained by hydrolysis and/or condensation of one or more kinds of silicon compounds shown by the following general formula (C-1):

$$R^{1C}{}_{c1}R^{2C}{}_{c2}R^{3C}{}_{c3}Si(OR^{0C})_{(4-c1-c2-c3)} \quad (C-1)$$

wherein, $R^{0C}$ represents a hydrocarbon group having 1 to 6 carbon atoms; $R^{1C}$, $R^{2C}$, $R^{3C}$ represent a hydrogen atom or an organic group having 1 to 30 carbon atoms; and c1, c2 and c3 represent 0 or 1 and satisfy 1≤c1+c2+c3≤3.

By further adding the component (C), a resist lower layer film more excellent in pattern adhesiveness can be obtained.

At this time, the component (C) is preferably a silicon-containing compound obtained by hydrolysis and/or condensation of a mixture containing one or more kinds of silicon compounds shown by the general formula (C-1) and one or more kinds of silicon compounds shown by the following general formula (C-2):

$$Si(OR^{4C})_4 \quad (C-2)$$

wherein, $R^{4C}$ represents a hydrocarbon group having 1 to 6 carbon atoms.

Also, any one or more of $R^{1C}$, $R^{2C}$ and $R^{3C}$ in the general formula (C-1) is preferably an organic group containing a hydroxyl group or a carboxyl group, the groups being substituted with an acid-labile group.

Such a component (C) is employed, pattern adhesiveness can be further improved.

Moreover, the composition for forming a metal oxide-containing film preferably further comprises an acid and/or a thermal acid generator.

Such a composition for forming a metal oxide-containing film is employed, resolution of the pattern can be further improved in addition to the above-mentioned characteristics.

Furthermore, the present invention is to provide a patterning process to form a pattern on a body to be processed, wherein, a metal oxide-containing film is formed on a body to be processed by using the composition for forming a metal oxide-containing film, a resist upper layer film is formed on the metal oxide-containing film by using a resist upper layer film composition, the resist upper layer film is exposed to form a resist pattern, pattern transfer of the resist pattern is made onto the metal oxide-containing film, and then the body to be processed which is under the metal oxide-containing film is processed by etching by using the metal oxide-containing film having the transferred pattern as an etching mask.

Such a patterning process is employed, the metal oxide-containing film has high etching selectivity to the resist upper layer film, and when the pattern is formed, it has excellent pattern adhesiveness whereby fine pattern can be formed onto the body to be processed.

Further, the present invention is to provide a patterning process to form a pattern on a body to be processed, wherein, a silicon-containing film is formed on a body to be processed by using a silicon-containing film composition, a metal oxide-containing film is formed on the silicon-containing film by using the composition for forming a metal oxide-containing film, a resist upper layer film is formed on the metal oxide-containing film by using a resist upper layer film composition, the resist upper layer film is exposed to form a resist pattern, pattern transfer of the resist pattern is made onto the metal oxide-containing film, pattern transfer is made onto the silicon-containing film which is under the metal oxide-containing film having the transferred pattern by dry or wet etching, and then the body to be processed is processed by etching by using the silicon-containing film having the transferred pattern as an etching mask.

Moreover, the present invention is to provide a patterning process to form a pattern on a body to be processed, wherein, an organic film is formed on the body to be processed by using an organic film composition, a metal oxide-containing film is formed on the organic film by using the composition for forming a metal oxide-containing film, a resist upper layer film is formed on the metal oxide-containing film by using a resist upper layer film composition, the resist upper layer film is exposed to form a resist pattern, pattern transfer of the resist pattern is made onto the metal oxide-containing film, pattern transfer is made onto the organic film which is under the metal oxide-containing film having the transferred pattern by dry or wet etching, and then the body to be processed is processed by etching by using the organic film having the transferred pattern as an etching mask.

Furthermore, the present invention is to provide a patterning process to form a pattern on a body to be processed, wherein, an inorganic-carbon film is formed on a body to be processed by using an inorganic-carbon film composition, a metal oxide-containing film is formed on the inorganic-carbon film by using the composition for forming a metal oxide-containing film, a resist upper layer film is formed on the metal oxide-containing film by using a resist upper layer film composition, the resist upper layer film is exposed to form a resist pattern, pattern transfer of the resist pattern is made onto the metal oxide-containing film, pattern transfer is made onto the inorganic-carbon film which is under the metal oxide-containing film having the transferred pattern by dry or wet etching, and then the body to be processed is processed by etching by using the inorganic-carbon film having the transferred pattern as an etching mask.

Thus, the patterning process of the present invention can form a pattern formed by the resist upper layer film onto the body to be processed without generating a difference in size conversion by optimizing the combination of a silicon-containing film, an organic film and an inorganic-carbon film.

At this time, the resist upper layer film is preferably exposed by the method of photolithography with the wavelength of 300 nm or less or an EUV beam, by the method of a direct drawing with an electron beam, or by the method of nanoimprint lithography.

By using the above process, fine pattern can be formed on the resist upper layer film.

Also, the patterning process preferably contains, after pattern transfer is made onto the layer which is under the metal oxide-containing film having the transferred pattern, a step of removing the metal oxide-containing film by using aqueous ammonia containing hydrogen peroxide or hydrochloric acid containing hydrogen peroxide.

The patterning process of the present invention can contain the process of stripping and removing the resist film without remaining the residue, under the mild conditions which do not provide any damage against the body to be processed.

By using the metal oxide-containing film formed by using the composition for forming a metal oxide-containing film of the present invention as a resist lower layer film, it shows etching selectivity to a silicon-containing film, an organic film and an inorganic-carbon film, and the body to be processed can be processed with high precision. Further, after using it as an etching mask, it can be removed by mild wet stripping conditions so that it can be removed without generating any damage to the under layers such as the body to be processed, etc. In addition, pattern adhesiveness is also excellent, so that fine pattern can be formed onto the body to be processed.

DETAILED DESCRIPTION OF THE PREFERRED EMBODIMENTS

The present inventors have investigated on lithographic characteristics and stability of a composition for forming a silicon-containing resist lower layer film to date, and prepared a resist lower layer film having etching selectivity and storage stability by using a silicon-containing compound. However, as compared with those days, miniaturization of the semiconductor apparatus is further progressed, and not only the line width of the pattern is becoming fine, but also a structure of the logic circuit in the semiconductor apparatus is becoming complicated. For example, in the multilayer resist method using the conventional silicon-containing compound as a resist lower layer film, the silicon-containing resist lower layer film using as an etching mask remains on the organic film as a residue with a thickness of several nm when the processing of the organic film has been finished. In general, this residue can be completely removed from the surface of the organic film in the next processing of the substrate to be processed. On the other hand, as the other conditions, it is also possible on paper to consider the case where the residue of the silicon-containing resist lower layer film is removed before processing the substrate to be processed. However, for example, if the silicon-containing resist film is tried to strip by the dry stripping (dry rework), i.e., by dry etching, the surface of the substrate to be processed which became bare by the pattern transfer is damaged by plasma generated in the dry stripping process, and it is not really established as a process. Also, it is possible on paper to consider the conditions to remove the residue of the silicon-containing resist lower layer film by wet stripping, but when a stripping solution which dissolves silicon such as a hydrofluoric acid series stripping solution is used for wet stripping of the silicon-containing resist lower layer film, there is a possibility of damaging not only the surface of the substrate which became bare but also the whole wafer. Thus, in the process of substantially using a silicon-containing resist lower layer film, a residue of the silicon-containing resist lower layer film remained after processing of the organic film could not help removing with the processing of the substrate to be processed simultaneously.

On the other hand, it has been known that the resist film comprising a metal-containing compound such as titanium can be striped by a stripping solution containing hydrogen peroxide. In Japanese Patent Laid-Open Publication No. 61-185928, titanium nitride is used as a resist lower layer film, and then, it is finally removed by a stripping solution containing hydrogen peroxide. However, in those days, a patterning technique by ArF exposure did not exist, so that it is unclear whether the ArF pattern could be formed by the process or not. The present inventors have improved that the metal-containing compound can be used as a resist lower layer film for fine processing using the current ArF exposure process, and by constructing the multi-layer resist process using the resist lower layer film which comprises a metal oxide-containing film, whereby the present invention has been accomplished.

That is, the present invention is directed to a composition for forming a metal oxide-containing film comprising:

as a component (A), a metal oxide-containing compound $A_1$ obtained by hydrolysis and/or condensation of one or more kinds of hydrolysable metal compounds shown by the following general formula (A-1),

(A-1)

wherein, $R^{0A}$ and $R^{1A}$ represent an organic group having 1 to 30 carbon atoms; a0, a1 and a2 represent an integer of 0 or more and a0+a1+2×a2 is the same number as the number determined by valency of L; and L is any of aluminum, gallium, yttrium, titanium, zirconium, hafnium, bismuth, tin, vanadium, and tantalum, as a component (B), an aromatic compound shown by the following general formula (B-1), the compound generating a hydroxyl group by thermal and/or an acid,

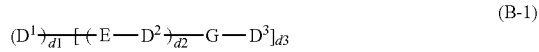
(B-1)

wherein, d1 and d3 represent an integer of 1, 2 or 3; d2 represents an integer of 0, 1 or 2; E and G represent a single bond or a divalent organic group composed of one or more of carbon, oxygen and hydrogen atom; and each $D^1$, $D^2$ and $D^3$ may be the same or different and represents an organic group shown by the following general formula (B-1a) or (B-1b),

(B-1a)

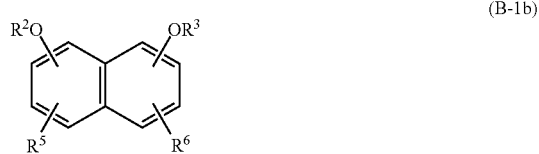
(B-1b)

wherein, each $R^1$, $R^2$ and $R^3$ may be the same or different and represents an organic group shown by the following general formula (B-1c), (B-1d) or (B-1e); and each $R^4$, $R^5$ and $R^6$ may be the same or different and represents a hydrogen atom or an alkyl group having 1 to 20 carbon atoms, and two alkyl groups may be bonded to form a cyclic substituent,

(B-1c)

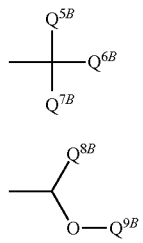
(B-1d)

(B-1e)

wherein, $Q^{1B}$ to $Q^{4B}$ represent a hydrogen atom or an alkyl group having 1 to 20 carbon atoms, and two substituents arbitrarily selected from $Q^{1B}$ to $Q^{4B}$ may be bonded to form a cyclic substituent; $Q^{5B}$ to $Q^{7B}$ represent an alkyl group having 1 to 20 carbon atoms, and two substituents arbitrarily selected from $Q^{5B}$ to $Q^{7B}$ may be bonded to form a cyclic substituent; and $Q^{8B}$ and $Q^{9B}$ represent an alkyl group having 1 to 20 carbon atoms, and $Q^{8B}$ and $Q^{9B}$ may be bonded each other to form a cyclic substituent.

The Component (A)

The component (A) of the composition for forming a metal oxide-containing film of the present invention can be prepared by using one or more kinds of hydrolysable metal compounds shown by the following general formula (A-1) as a raw material:

(A-1)

wherein, $R^{0A}$ and $R^{1A}$ represent an organic group having 1 to 30 carbon atoms; a0, a1 and a2 represent an integer of 0 or more and a0+a1+2×a2 is the same number as the number determined by valency of L; and L is any of aluminum, gallium, yttrium, titanium, zirconium, hafnium, bismuth, tin, vanadium, and tantalum.

The hydrolysable metal compounds shown by the above general formula (A-1) may be exemplified by the following.

When L is aluminum, there may be exemplified by aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethylacetoacetate, aluminum dibutoxyethylacetoacetate, aluminum propoxybisethylacetoacetate, aluminum butoxybisethylacetoacetate, aluminum 2,4-pentanedionate, aluminum 2,2,6,6-tetramethyl-3,5-heptanedionate, etc., as a monomer.

When L is gallium, there may be exemplified by gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxy ethoxide, gallium ethoxyethoxide, gallium dipropoxyethylacetoacetate, gallium dibutoxyethylacetoacetate, gallium propoxybisethylacetoacetate, gallium butoxybisethylacetoacetate, gallium 2,4-pentanedionate, gallium 2,2,6,6-tetramethyl-3,5-heptanedionate, etc., as a monomer.

When L is yttrium, there may be exemplified by yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethylacetoacetate, yttrium dibutoxyethylacetoacetate, yttrium propoxybisethylacetoacetate, yttrium butoxybisethylacetoacetate, yttrium 2,4-pentanedionate, yttrium 2,2,6,6-tetramethyl-3,5-heptanedionate, etc., as a monomer.

When L is titanium, there may be exemplified by titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxybisethylacetoacetate, titanium dibutoxybisethylacetoacetate, titanium dipropoxy-bis-2,4-pentanedionate, titanium dibutoxy-bis-2,4-pentanedionate, etc., as a monomer.

When L is zirconium, there may be exemplified by methoxy zirconium, ethoxy zirconium, propoxy zirconium, butoxy zirconium, phenoxy zirconium, zirconium dibutoxide bis(2,4-pentanedionate), zirconium dipropoxide bis(2,2,6,6-tetramethyl-3,5-heptanedionate), etc., as a monomer.

When L is hafnium, there may be exemplified by hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxy ethoxide, hafnium ethoxyethoxide, hafnium dipropoxybisethylacetoacetate, hafnium dibutoxybisethylacetoacetate, hafnium dipropoxy-bis-2,4-pentanedionate, hafnium dibutoxy-bis-2,4-pentanedionate, etc., as a monomer.

When L is bismuth, there may be exemplified by methoxy bismuth, ethoxy bismuth, propoxy bismuth, butoxy bismuth, phenoxy bismuth, etc., as a monomer.

When L is tin, there may be exemplified by methoxy tin, ethoxy tin, propoxy tin, butoxy tin, phenoxy tin, methoxyethoxy tin, ethoxyethoxy tin, tin 2,4-pentanedionate, tin 2,2, 6,6-tetramethyl-3,5-heptanedionate, etc., as a monomer.

When L is vanadium, there may be exemplified by vanadium oxide-bis(2,4-pentanedionate), vanadium 2,4-pentanedionate, vanadium oxide tributoxide, vanadium oxide tripropoxide, etc., as a monomer.

When L is tantalum, there may be exemplified by methoxy tantalum, ethoxy tantalum, propoxy tantalum, butoxy tantalum, phenoxy tantalum, etc., as a monomer.

As the other raw materials of the component (A), one or more hydrolysable metal compounds shown by the following general formula (A-2) can be used.

$$M(OR^{3,4})_{a3}(OR^{4,4})_{a4}(O)_{a5} \quad (A-2)$$

wherein $R^{3,4}$, $R^{4,4}$ represent an organic group having 1 to 10 carbon atoms; a3, a4 and a5 represent an integer of 0 or more, and a3+a4+2×a5 is the same number as the number determined by valency of M; and the M is an element belonging to groups of III, IV, or V in a periodic table except for carbon and is an element different from L.

As the hydrolysable metal compounds shown by the above formula (A-2), the following compounds can be exemplified.

When M is boron, there may be exemplified by boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, boron oxide, etc., as a monomer.

When M is silicon, there may be exemplified by tetramethoxy silane, tetraethoxy silane, tetrapropoxy silane, tetraisopropoxy silane, tetrabutoxy silane, tetraphenoxy silane, tetraacetoxy silane, etc., as a monomer.

When M is germanium, there may be exemplified by germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, germanium ethoxyethoxide, etc., as a monomer.

When M is arsenic, there may be exemplified by methoxy arsenic, ethoxy arsenic, propoxy arsenic, butoxy arsenic, phenoxy arsenic, etc., as a monomer.

When M is phosphorus, there may be exemplified by trimethyl phosphite, triethyl phosphite, tripropyl phosphite, trimethyl phosphate, triethyl phosphate, tripropyl phosphate, diphosphorus pentaoxide, etc., as a monomer.

When M is any of aluminum, gallium, yttrium, titanium, zirconium, hafnium, bismuth, tin, vanadium and tantalum, the hydrolysable metal compounds shown by the general formula (A-2) may be exemplified by the same compounds as those of the general formula (A-1).

The hydrolysable metal compounds represented by the above-mentioned general formula (A-1) and the general formula (A-2) (hereinafter referred to the metal compound) can be made the metal oxide-containing compound by hydrolysis and/or condensation in the absence of a catalyst or in the presence of an acid catalyst or an alkali catalyst. At this time, as the acid catalyst, one or more compounds selected from the group consisting of an inorganic acid, an aliphatic sulfonic acid, an aromatic sulfonic acid, an aliphatic carboxylic acid and an aromatic carboxylic acid is used as the acid catalyst to produce the objective compound.

The acid catalyst to be used may be exemplified by hydrofluoric acid, hydrochloric acid, hydrobromic acid, sulfuric acid, nitric acid, perchloric acid, phosphoric acid, methanesulfonic acid, benzenesulfonic acid, toluenesulfonic acid, formic acid, acetic acid, propionic acid, oxalic acid, malonic acid, maleic acid, fumaric acid, benzoic acid, etc. An amount of the catalyst to be used is preferably $10^{-6}$ to 10 mol, more preferably $10^{-5}$ to 5 mol, further preferably $10^{-4}$ to 1 mol based on 1 mol of the monomer.

Also, it may be produced by subjecting the metal compound to hydrolysis condensation in the presence of an alkali catalyst. The alkali catalyst to be used at this time may be exemplified by methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethylmonoethanolamine, monomethyldiethanolamine, triethanolamine, diazabicyclooctane, diazabicyclocyclononene, diazabicycloundecene, hexamethylenetetraamine, aniline, N,N-dimethyl aniline, pyridine, N,N-dimethylethanolamine, N,N-diethylethanolamine, N-(β-aminoethyl)ethanolamine, N-methylethanolamine, N-methyldiethanolamine, N-ethylethanolamine, N-n-butylethanolamine, N-n-butyldiethanolamine, N-tert-butylethanolamine, N-tert-butyldiethanolamine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, calcium hydroxide, etc. An amount of the catalyst to be used is preferably $10^{-6}$ mol to 10 mol, more preferably $10^{-5}$ mol to 5 mol, further preferably $10^{-4}$ mol to 1 mol based on 1 mol of the metal compound monomer.

An amount of water to be added to obtain the metal oxide-containing compound from the metal compound by hydrolysis or hydrolysis condensation is preferably 0.01 to 100 mol, more preferably 0.05 to 50 mol, further preferably 0.1 to 30 mol per 1 mol of the hydrolysable substituent bonded to the metal compound. If it is added in an amount of 100 mol or less, the device to be used for the reaction is not so large so that it is economical.

As an operating method, the metal compound is added to an aqueous catalyst solution to start the hydrolysis condensation reaction. At this time, the organic solvent may be added to the aqueous catalyst solution and/or the metal compound is previously diluted with the organic solvent. A reaction temperature is preferably 0 to 100° C., and more preferably 5 to 80° C. It is preferred the method that the temperature is maintained to 5 to 80° C. when the metal compound is added dropwise, and thereafter, the mixture is matured at 20 to 80° C.

Also, as the other reaction operation, water or a hydrated organic solvent is added to the metal compound or the organic solution containing the metal compound to start the hydrolysis reaction. At this time, the catalyst may be added to the metal compound or the organic solution containing the metal compound, or may be added to water or the hydrated organic solvent. A reaction temperature is preferably 0 to 100° C., more preferably 10 to 80° C. It is preferred the method that mixture is heated to 10 to 50° C. when water is added dropwise, and thereafter, the mixture is raised to 20 to 80° C. and matured.

The organic solvent which can be added to the aqueous catalyst solution, or can dilute the metal compound is preferably mentioned methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, acetylacetone, methyl acetoacetate, ethyl acetoacetate, propyl acetoacetate, butyl acetoacetate, methyl pivaloyl acetate, methyl isobutyroyl acetate, methyl caproyl acetate, methyl lauroyl acetate, 1,2-ethanediol, 1,2-propanediol, 1,2-butanediol, 1,2-pentanediol, 2,3-butanediol, 2,3-pentanediol, glycerin, diethylene glycol, hexylene glycol, etc., and a mixture thereof.

An amount of the organic solvent to be used is preferably 0 to 1,000 ml, particularly preferably 0 to 500 ml based on 1 mol of the metal compound. When the amount of the organic solvent to be used is 1,000 ml or less, the reaction apparatus is not so large so that it is economical.

Thereafter, neutralization reaction of the catalyst is performed, if necessary, and the alcohol generated by the hydrolysis condensation reaction is removed under reduced pressure to obtain an aqueous reaction mixture solution. At this time, an amount of the acid or the alkali which can be used for neutralization is preferably 0.1 to 2 equivalent based on the acid or the alkali used as the catalyst, and may be any substance which can be made the reaction mixture neutral.

Subsequently, it is preferred to remove the by-products such as the alcohol formed by the hydrolysis condensation reaction from the reaction mixture. At this time, a temperature of the reaction mixture to be heated may vary depending on the kinds of the organic solvents added and the alcohols generated by the reaction, etc., and is preferably 0 to 100° C., more preferably 10 to 90° C., further preferably 15 to 80° C. Also, a degree of the decompression at this time may vary depending on the kinds of the organic solvent and the alcohol, etc., to be removed, an exhaust apparatus, a condensing device and a heating temperature, preferably atmospheric pressure or lower, more preferably 80 kPa or lower with an absolute pressure, further preferably 50 kPa or lower with an absolute pressure. It is difficult to correctly determine an amount of the alcohol to be removed at this time, but about 80% by mass or more of the generated alcohol, etc., is desirably removed.

As a preferred solvent to be finally added to the metal oxide-containing compound solution, there may be exemplified by butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monobutyl ether, 1-butanol, 2-butanol, 2-methyl-1-propanol, 4-methyl-2-pentanol, acetone, tetrahydrofuran, toluene, hexane, ethyl acetate, cyclohexanone, methyl amyl ketone, propylene glycol dimethyl ether, diethylene glycol dimethyl ether, diamyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, etc.

A molecular weight of the obtained metal oxide-containing compound can be controlled not only by electing the metal compounds, but also controlling the reaction conditions at the time of the hydrolysis condensation. If the weight average molecular weight is 100,000 or less, neither an undesirable object nor a coating spot is generated so that the compound preferably having 100,000 or less, more preferably 200 to 50,000, further preferably 300 to 30,000 is preferably used. Incidentally, the data with regard to the above weight average molecular weight is shown by a molecular weight in terms of the polystyrene which is measured by gel permeation chromatography (GPC) using an RI as a detector and tetrahydrofuran as an eluting solvent, and using a polystyrene as the standard substance.

The metal oxide-containing compound $A_1$ means a material obtained by reacting one or more hydrolysable metal compounds shown by the above general formula (A-1) according to the above operation procedures.

The metal oxide-containing compound $A_2$ means a material obtained by reacting one or more hydrolysable metal compounds shown by the above general formula (A-1) and one or more hydrolysable metal compounds shown by the above general formula (A-2) according to the above operation procedures.

The metal oxide-containing compound $A_3$ means a material obtained by reacting one or more hydrolysable metal compounds shown by the above general formula (A-2) according to the above operation procedures.

The component (A) of the composition for forming a metal oxide-containing film of the present invention can be made any of the metal oxide-containing compound $A_1$, the metal oxide-containing compound $A_2$, a mixture of the metal oxide-containing compound $A_1$ and the metal oxide-containing compound $A_2$, and a mixture of the metal oxide-containing compound $A_1$ and the metal oxide-containing compound $A_3$.

Such a component (A) is used in the composition for forming a metal oxide-containing film, when it is made a resist lower layer film, high etching selectivity can be obtained and the stripping conditions can be made mild.

The Component (B)

As the component (B) of the composition for forming a metal oxide-containing film of the present invention, an aromatic compound shown by the following general formula (B-1), and generating a hydroxyl group by thermal and/or an acid can be used.

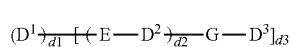  (B-1)

wherein, d1 and d3 represent an integer of 1, 2 or 3; d2 represents an integer of 0, 1 or 2; E and G represent a single bond or a divalent organic group composed of one or more of carbon, oxygen and hydrogen atom; and each $D^1$, $D^2$ and $D^3$ may be the same or different and represents an organic group shown by the following general formula (B-1a) or (B-1b),

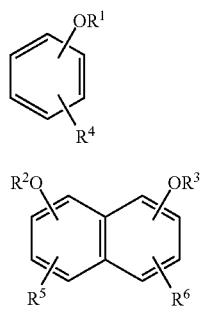

wherein, each $R^1$, $R^2$ and $R^3$ may be the same or different and represents an organic group shown by the following general formula (B-1c), (B-1d) or (B-1e); and each $R^4$, $R^5$ and $R^6$ may be the same or different and represents a hydrogen atom or an alkyl group having 1 to 20 carbon atoms, and two alkyl groups may be bonded to form a cyclic substituent,

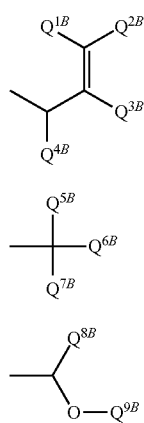

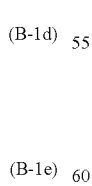

wherein, $Q^{1B}$ to $Q^{4B}$ represent a hydrogen atom or an alkyl group having 1 to 20 carbon atoms, and two substituents arbitrarily selected from $Q^{1B}$ to $Q^{4B}$ may be bonded to form a cyclic substituent; $Q^{5B}$ to $Q^{7B}$ represent an alkyl group having 1 to 20 carbon atoms, and two substituents arbitrarily selected from $Q^{5B}$ to $Q^{7B}$ may be bonded to form a cyclic substituent; and $Q^{8B}$ and $Q^{9B}$ represent an alkyl group having 1 to 20 carbon atoms, and $Q^{8B}$ and $Q^{9B}$ may be bonded each other to form a cyclic substituent.

As the aromatic compound shown by the above general formula (B-1), the following may be exemplified.

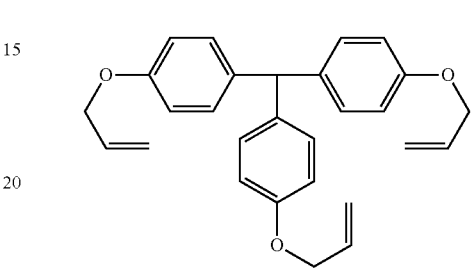

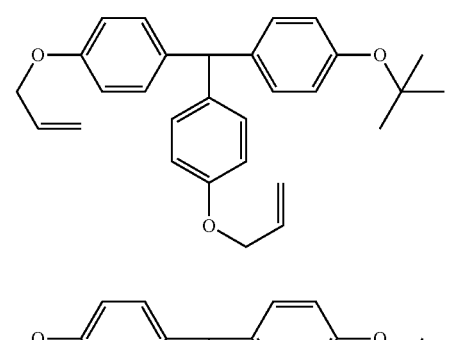

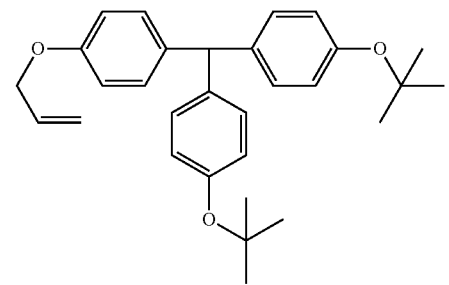

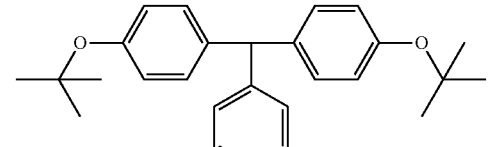

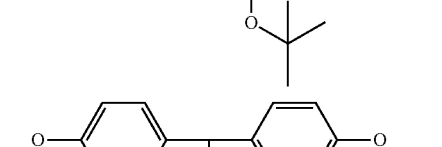

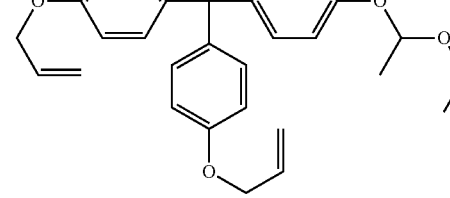

17
-continued
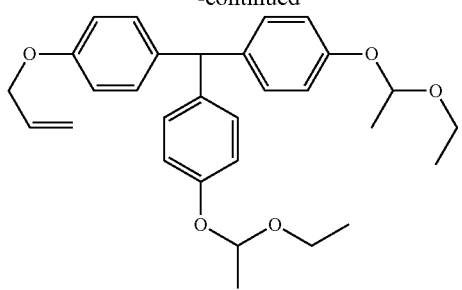
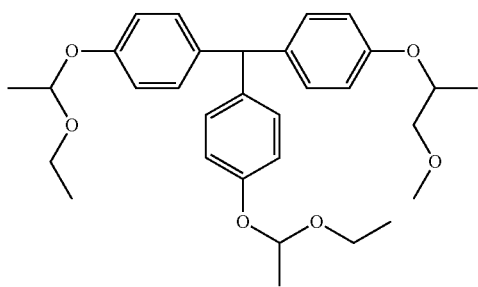
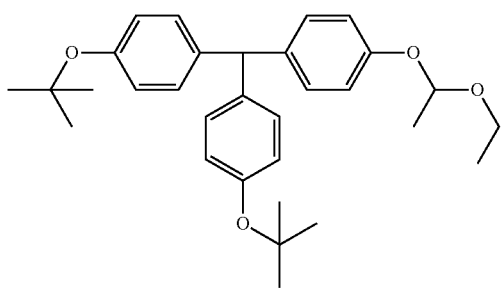
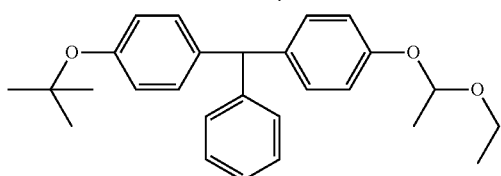
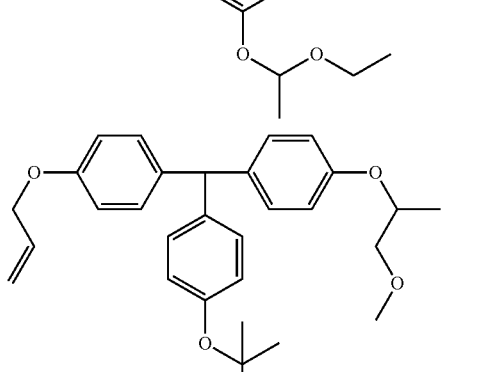
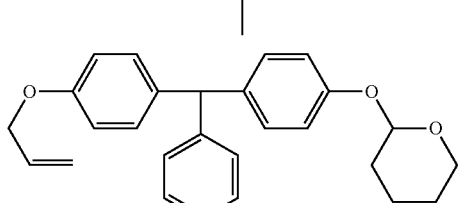
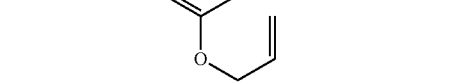
18
-continued
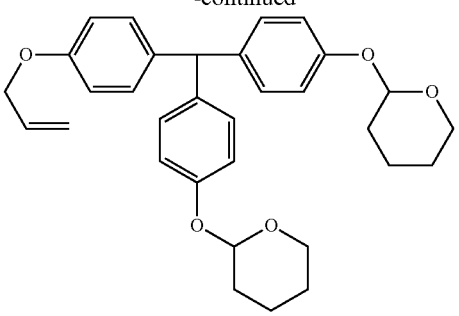
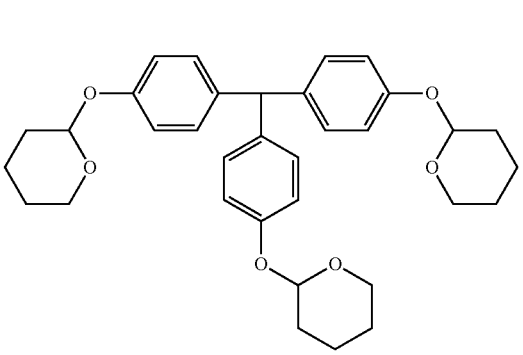
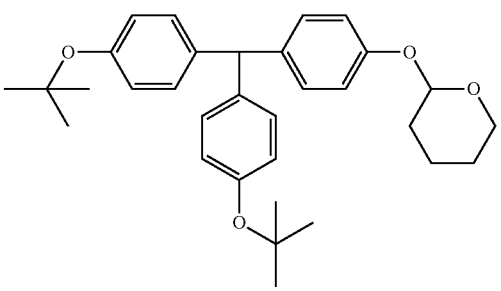
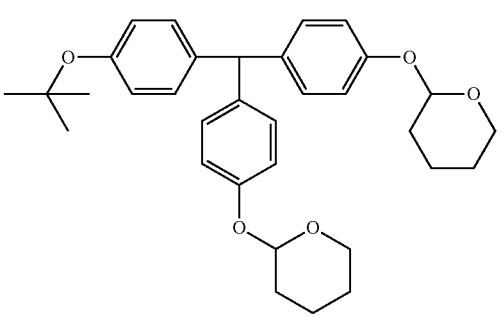
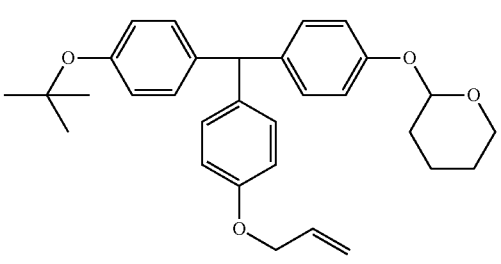

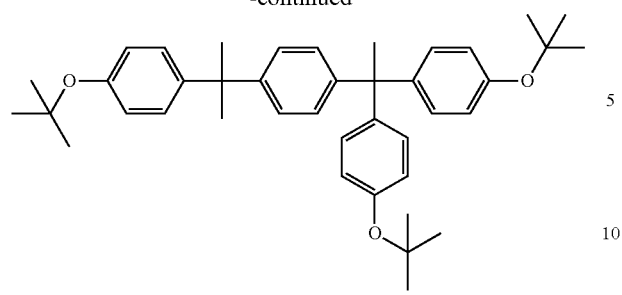
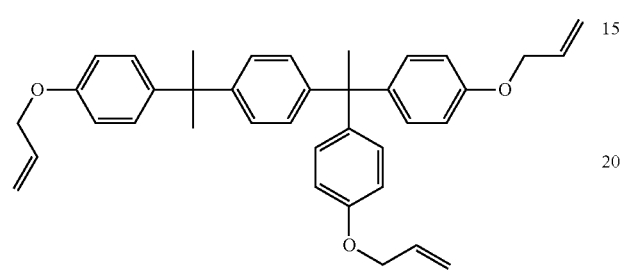
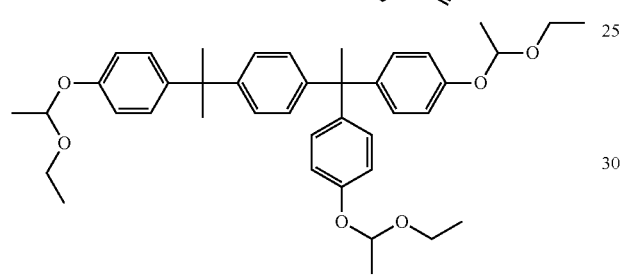
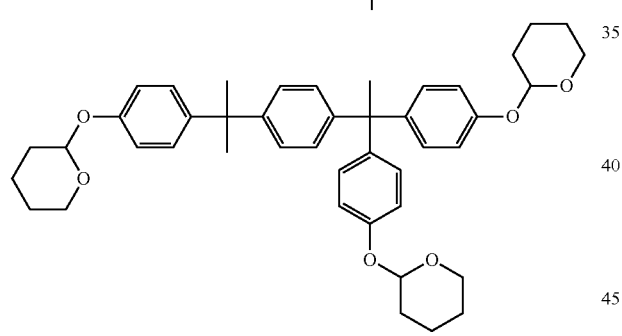
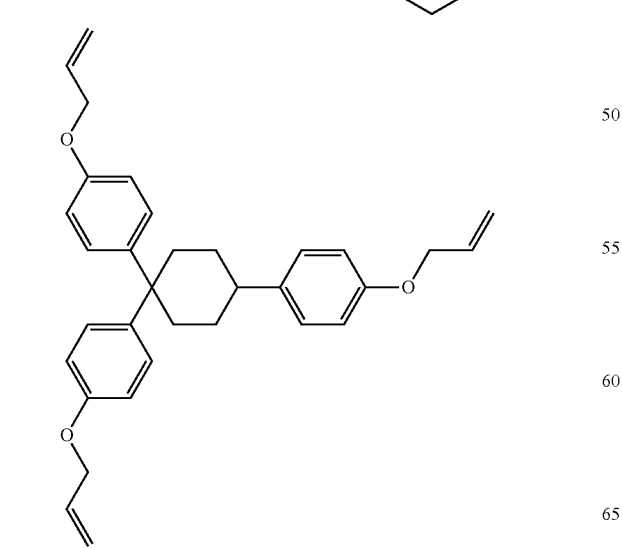
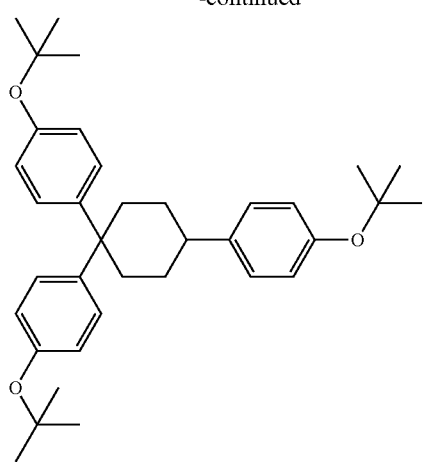
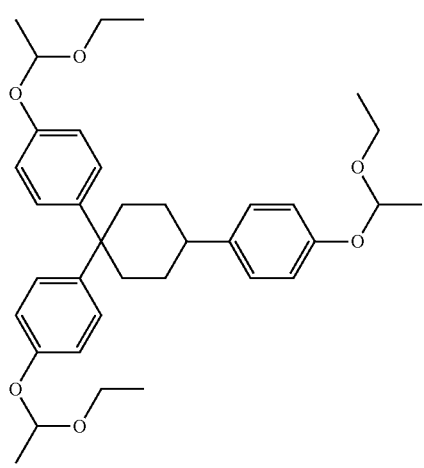
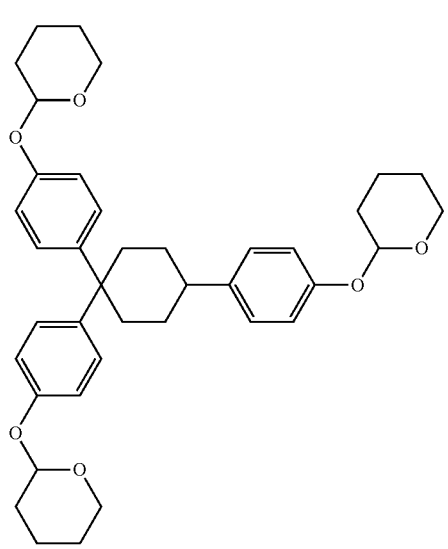

21
-continued
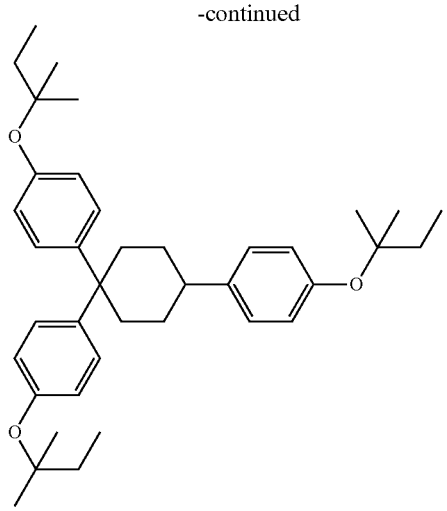
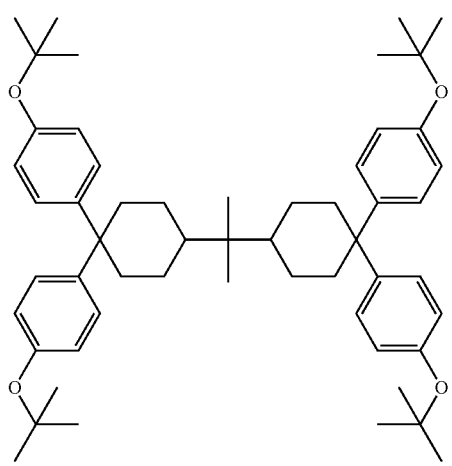
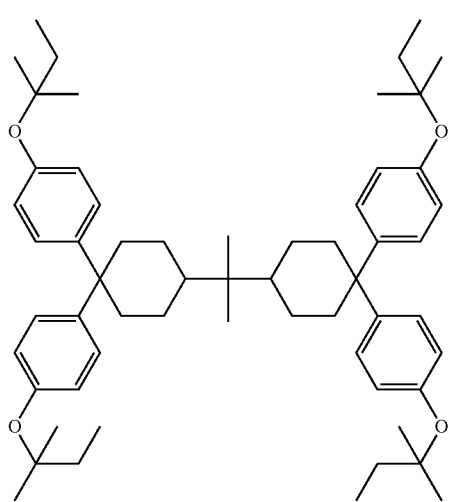
22
-continued
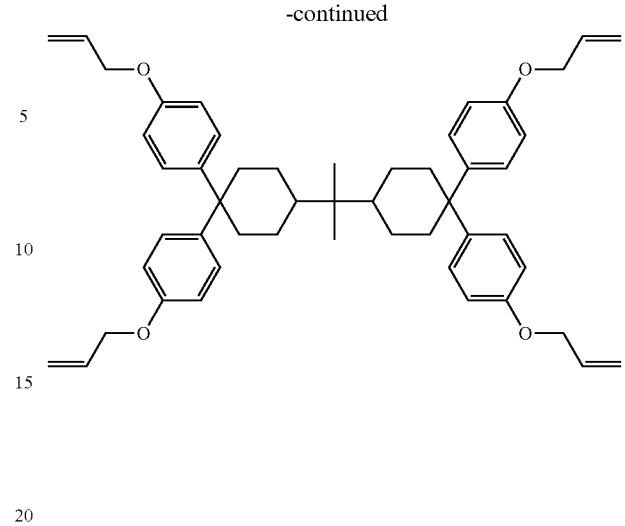
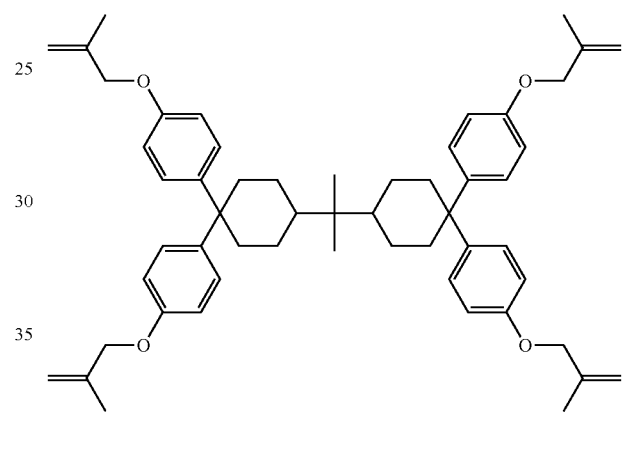
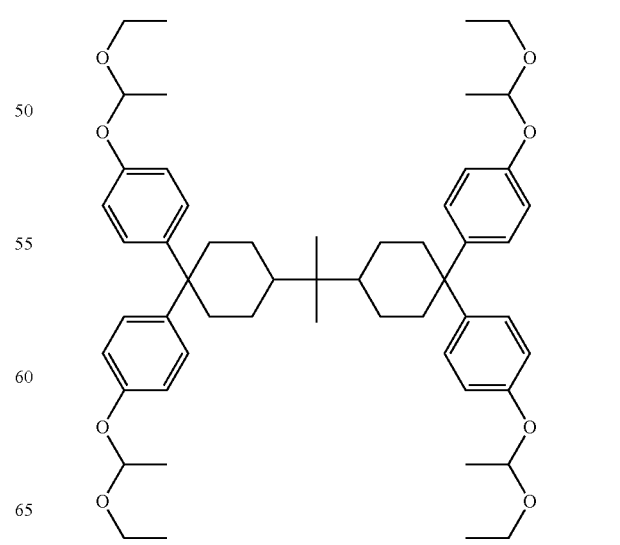

23
-continued
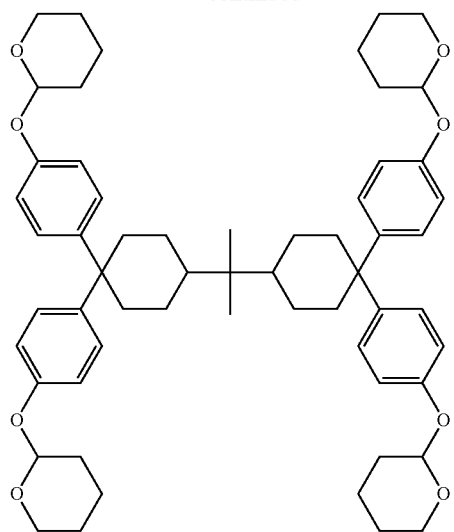
24
-continued
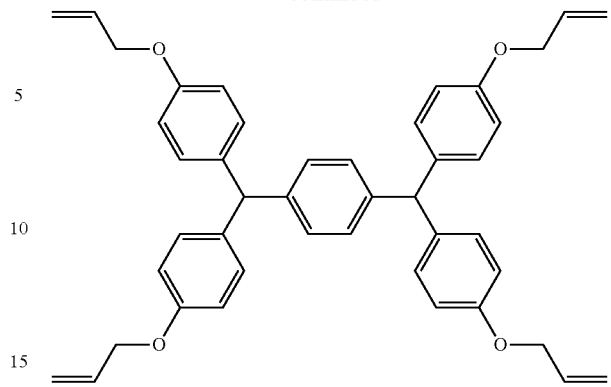
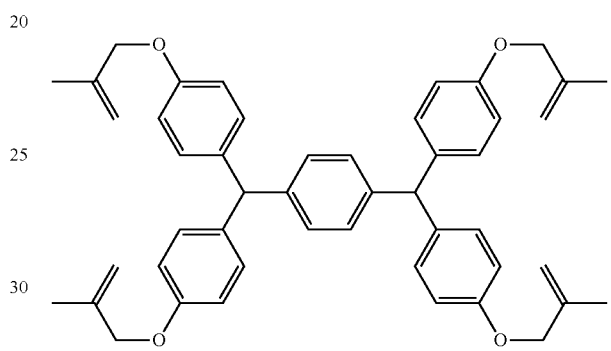
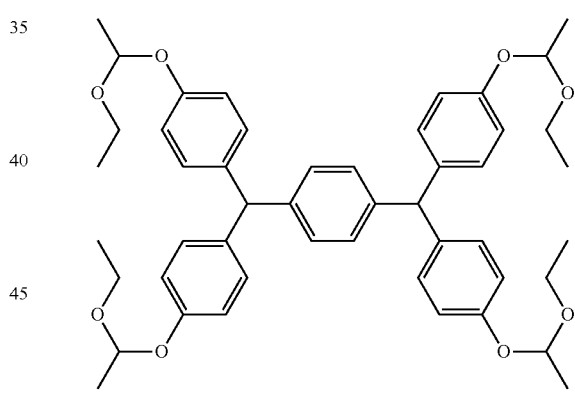
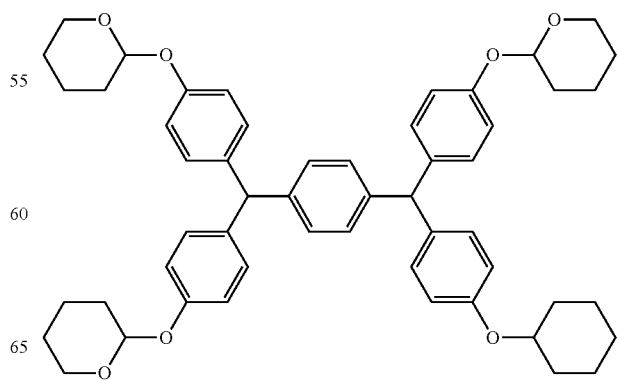

25
-continued
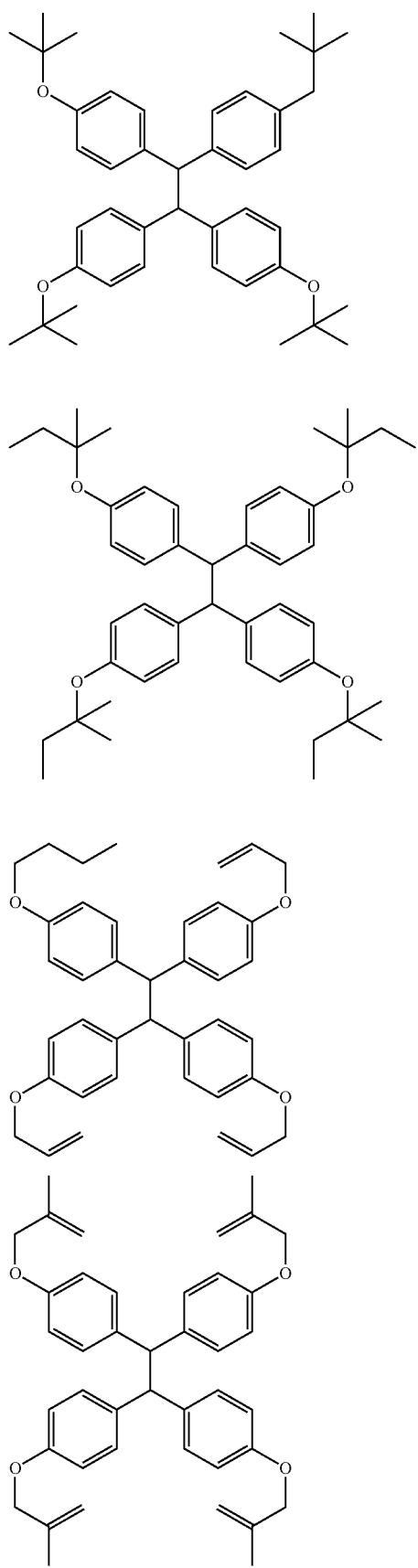
26
-continued
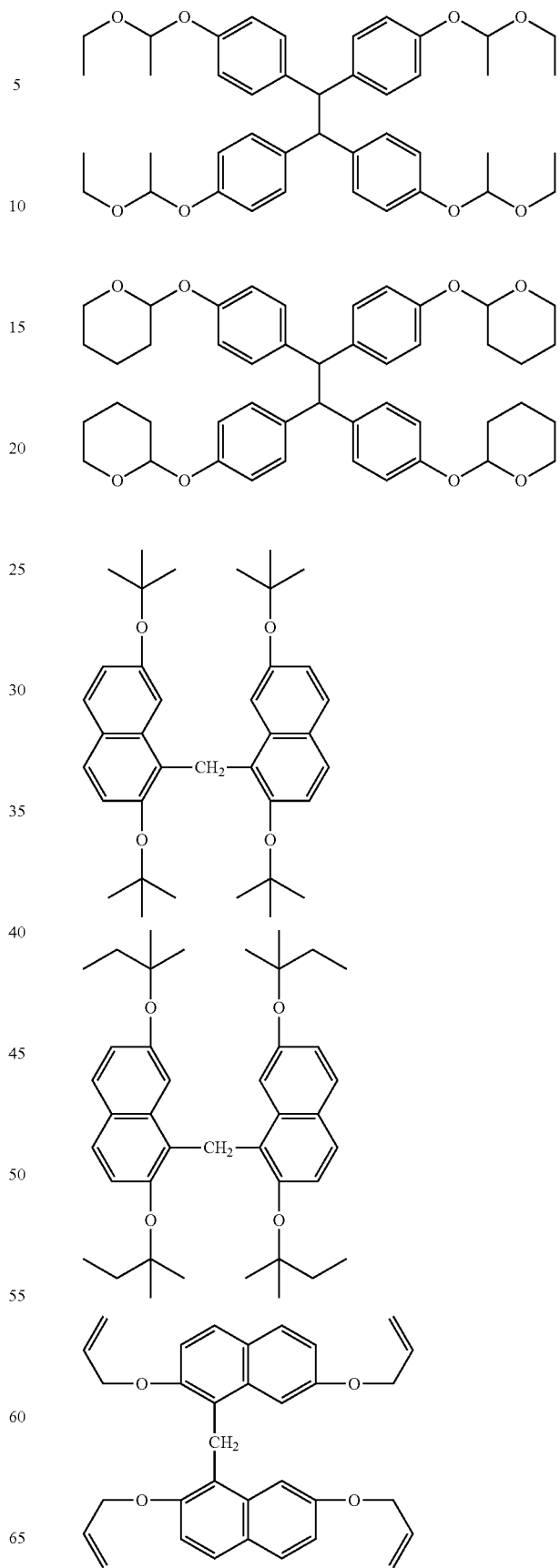

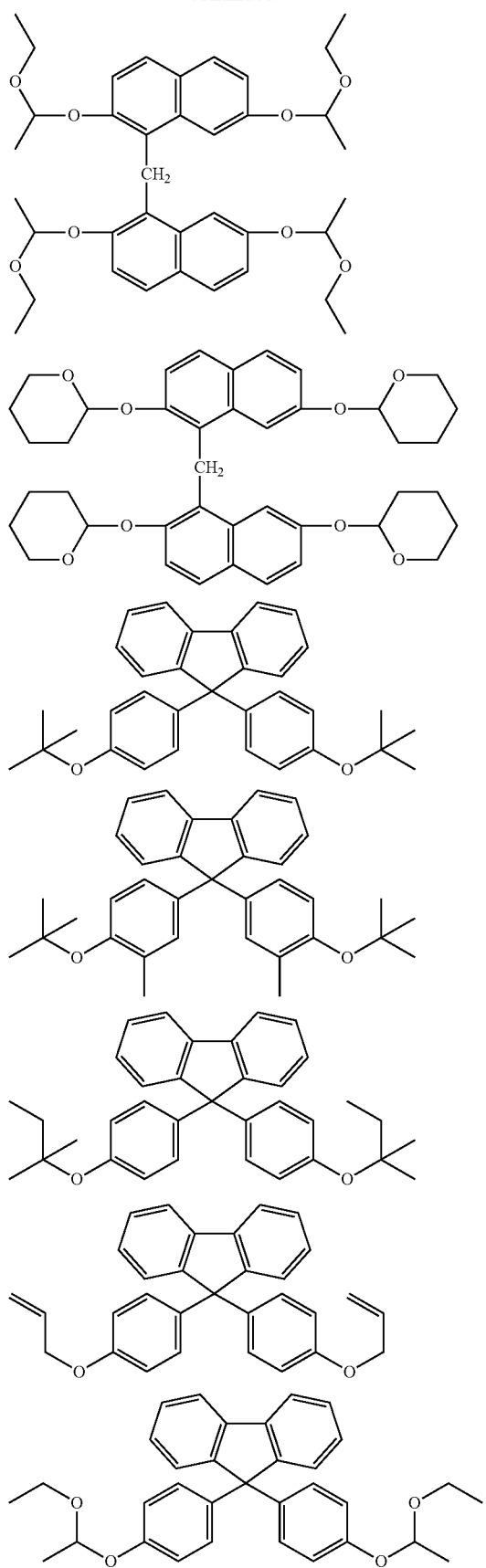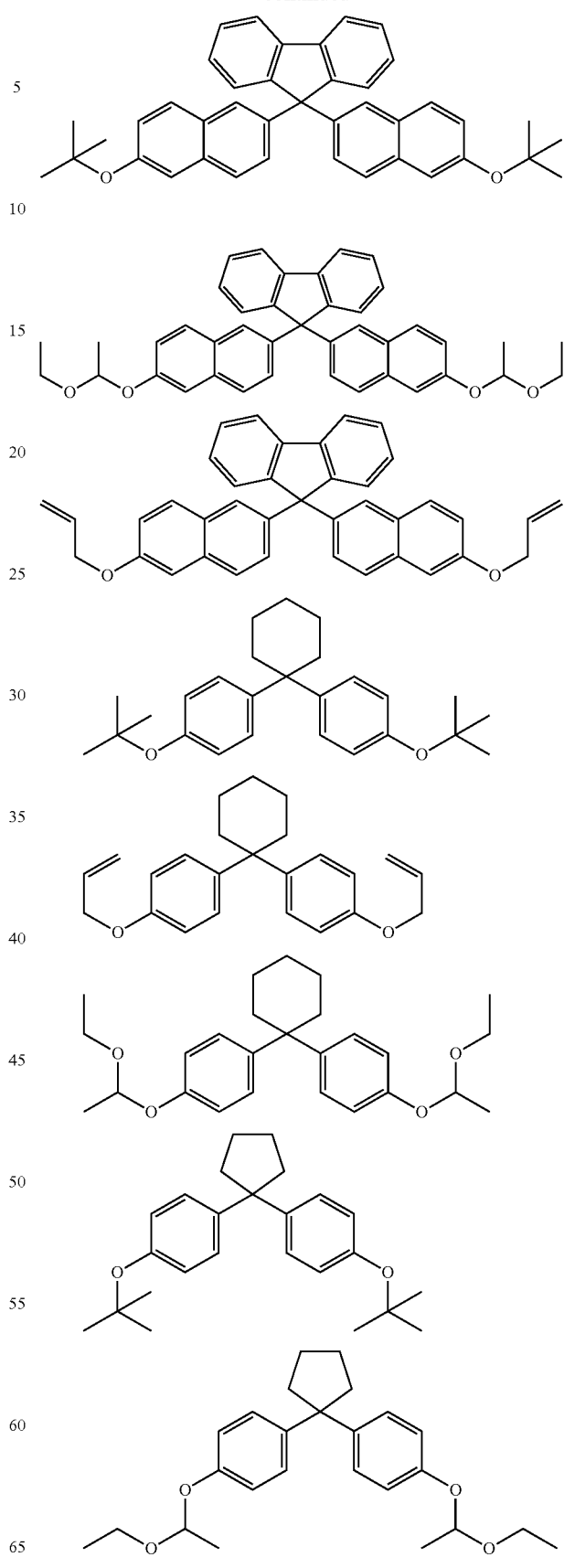

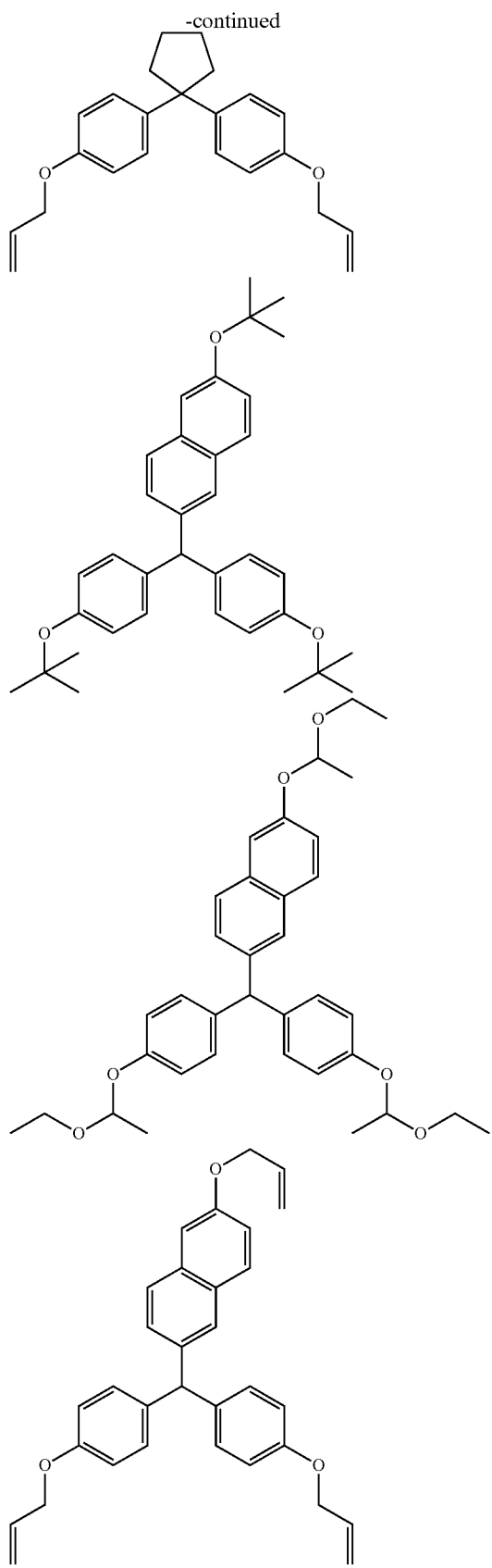

lower layer film, and a pattern is formed, pattern adhesiveness can be obtained and formation of fine pattern can be performed.

The Component (C)

As the component (C) of the composition for forming a metal oxide-containing film of the present invention, a silicon-containing compound may be further contained.

As the raw material of the component (C), one or more kinds of silicon compounds shown by the following general formula (C-1) can be used.

$$R^{1C}{}_{c1}R^{2C}{}_{c2}R^{3C}{}_{c3}Si(OR^{0C})_{(4-c1-c2-c3)} \qquad (C\text{-}1)$$

wherein $R^{0C}$ represents a hydrocarbon group having 1 to 6 carbon atoms; $R^{1C}$, $R^{2C}$ and $R^{3C}$ represent a hydrogen atom or a monovalent organic group having 1 to 30 carbon atoms, and c1, c2 and c3 represent 0 or 1 and satisfy $1 \leq c1+c2+c3 \leq 3$.

As least one of $R^{1C}$, $R^{2C}$ and $R^{3C}$ in the above general formula (C-1) may be an organic group containing a hydroxyl group or a carboxyl group, the groups being substituted with an acid-labile group, and such a silicon compound may be exemplified by the compound having 2 or 3 methoxy groups, ethoxy groups, propoxy groups or butoxy groups, etc., on the silicon atom shown by the following structure as a hydrolysable group.

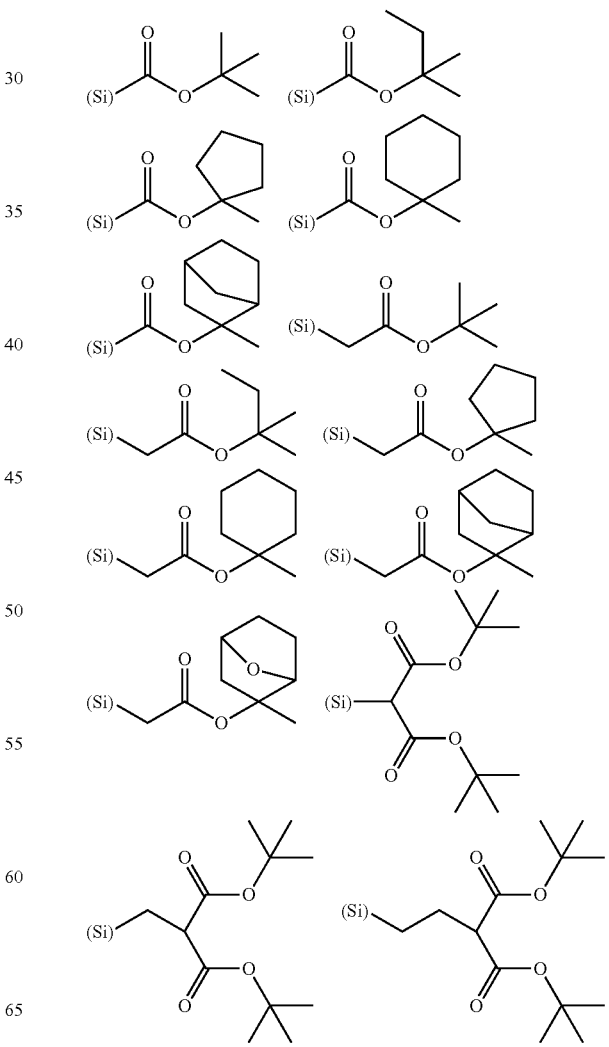

Such a component (B) is used in the composition for forming a metal oxide-containing film, when it is made a resist

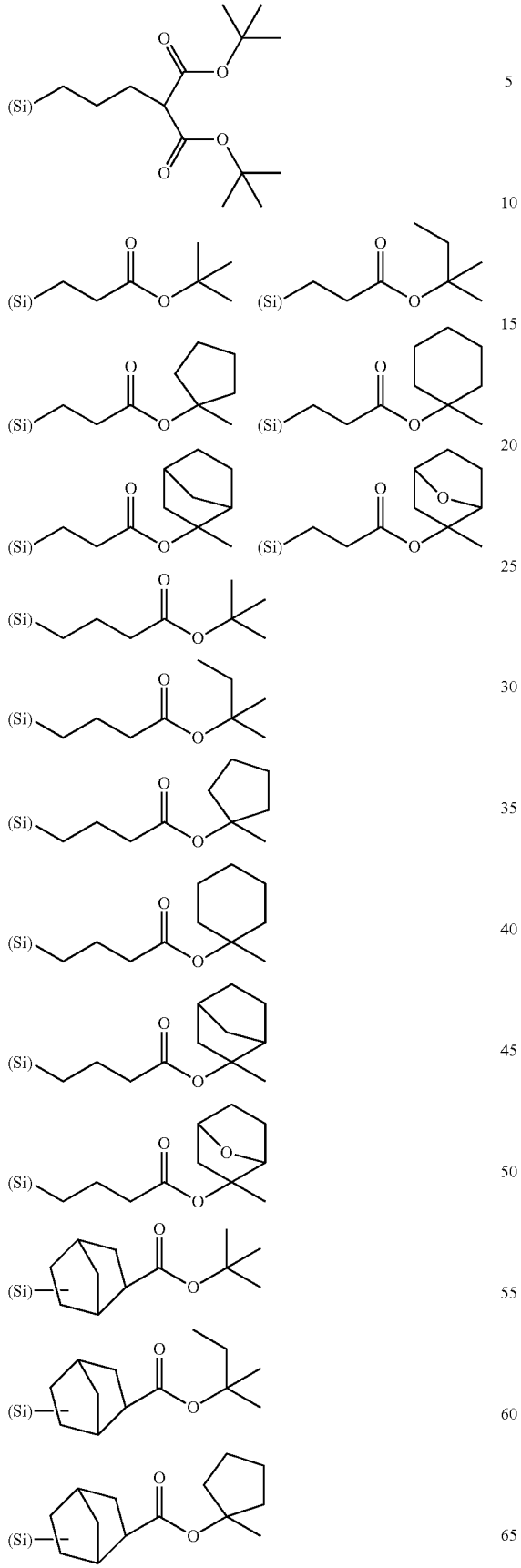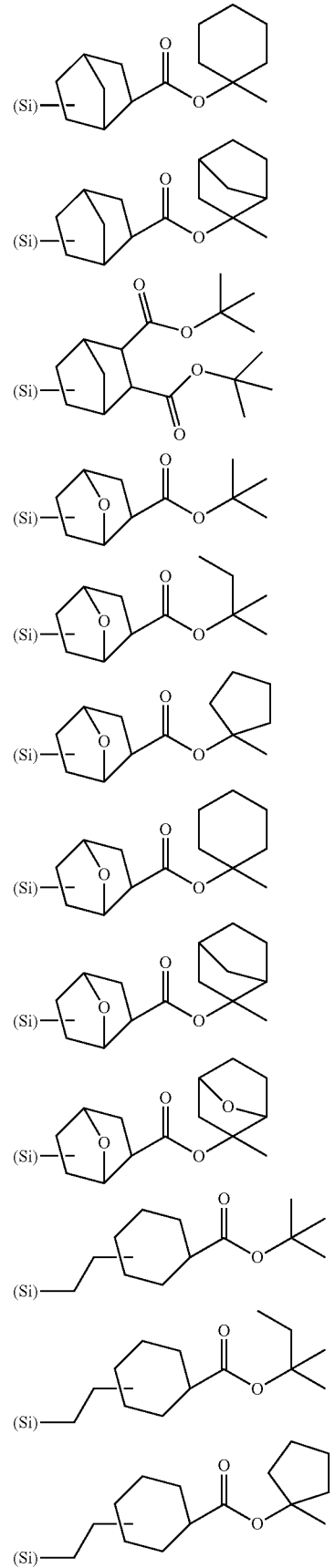

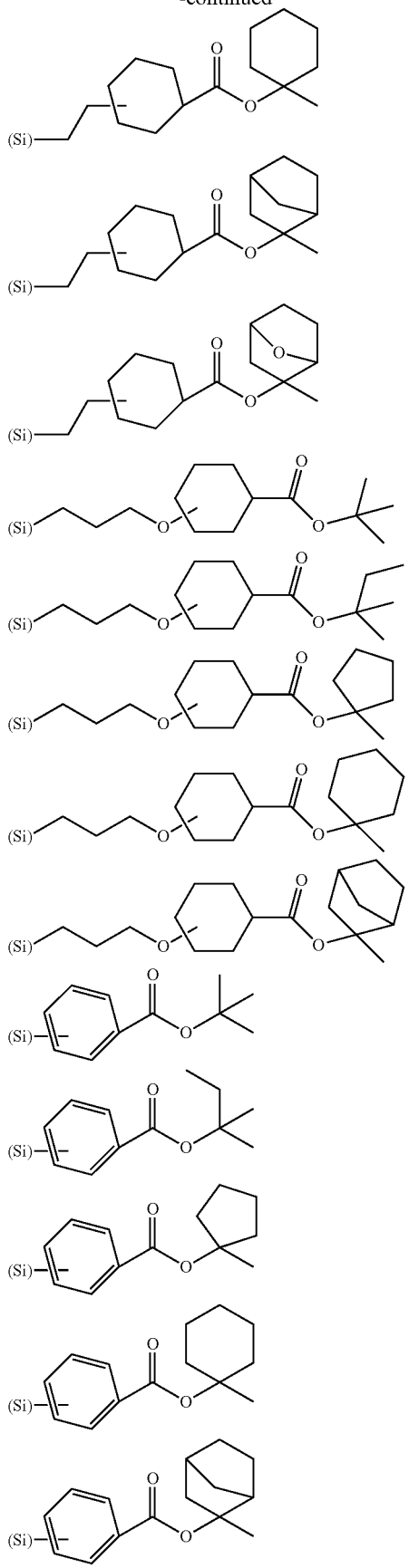
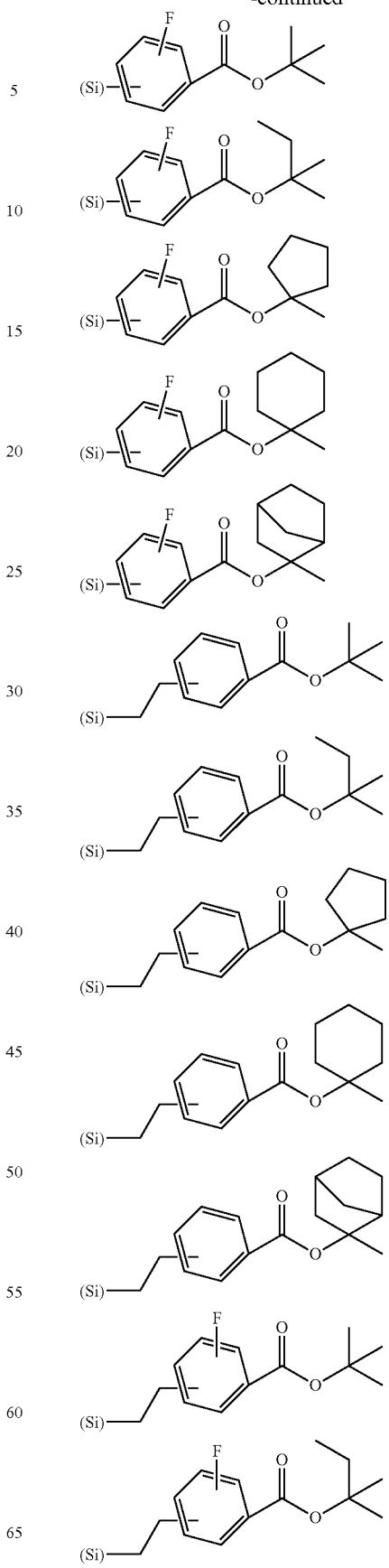

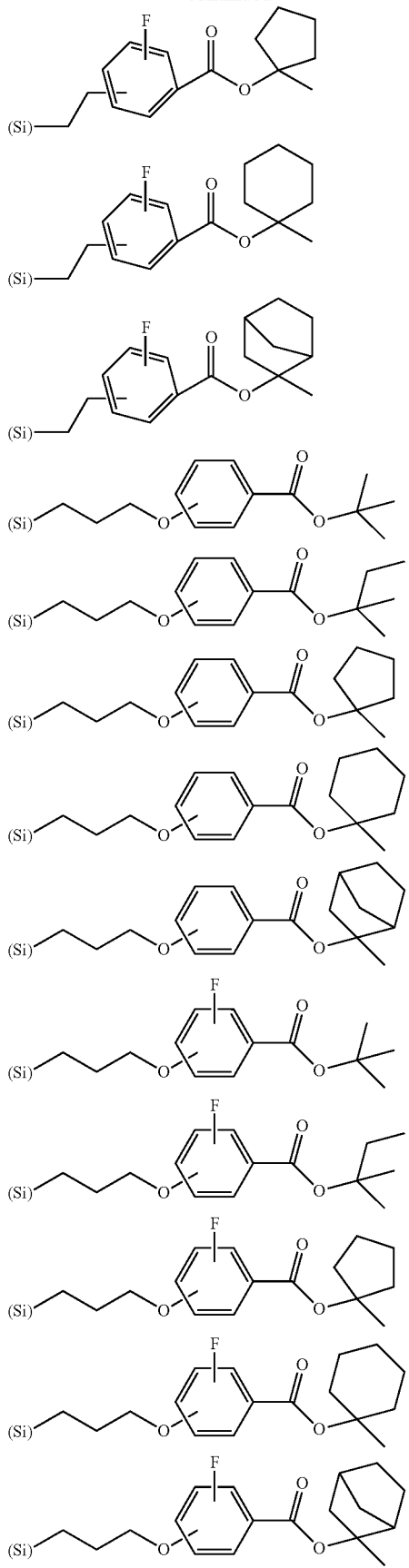
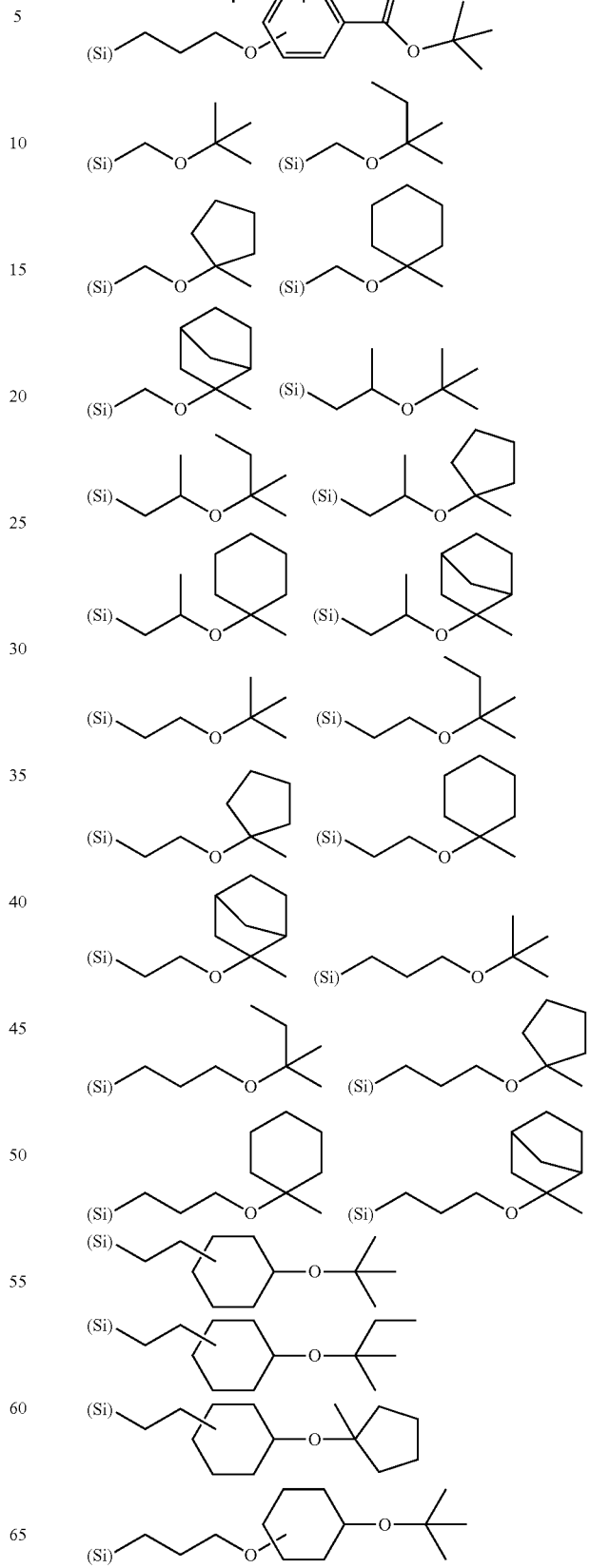

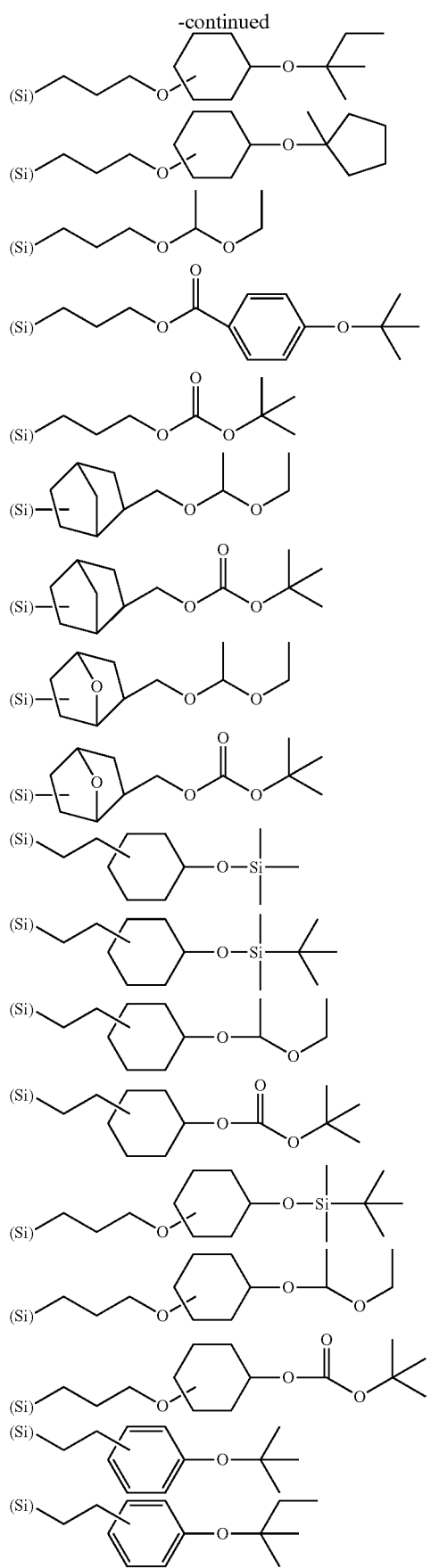
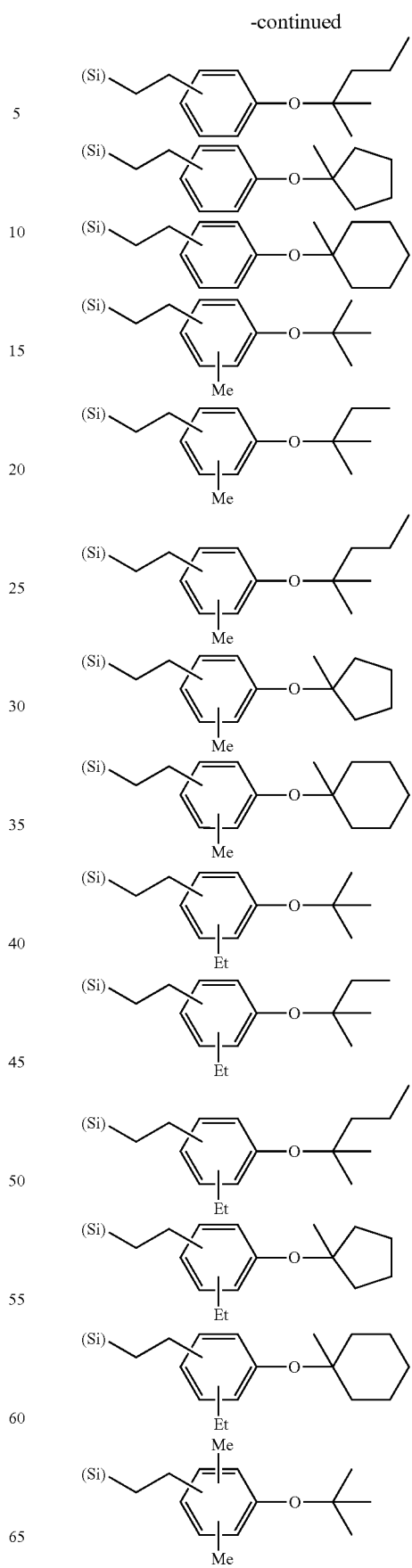

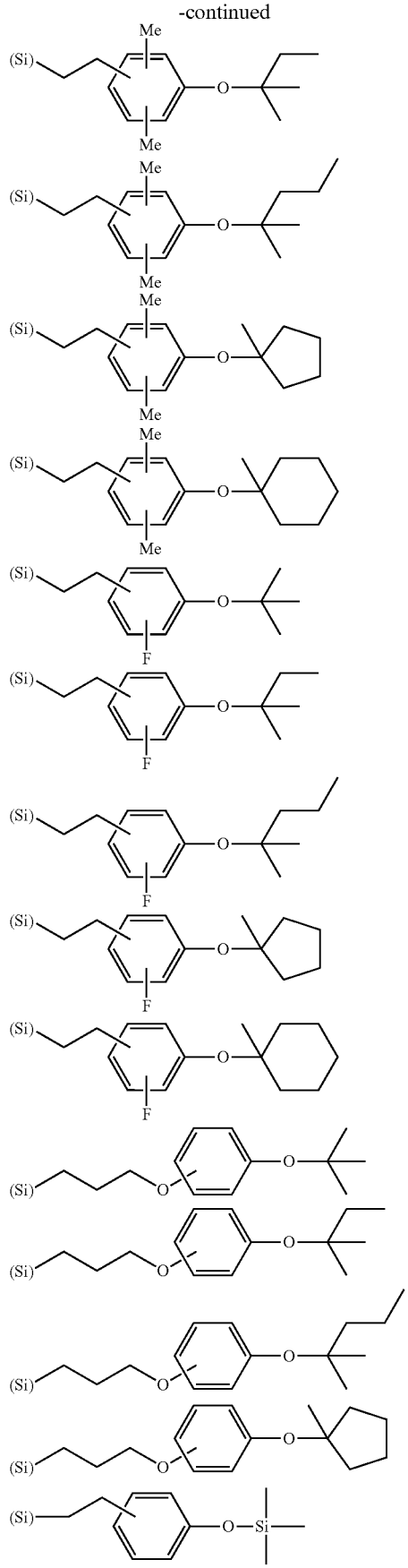
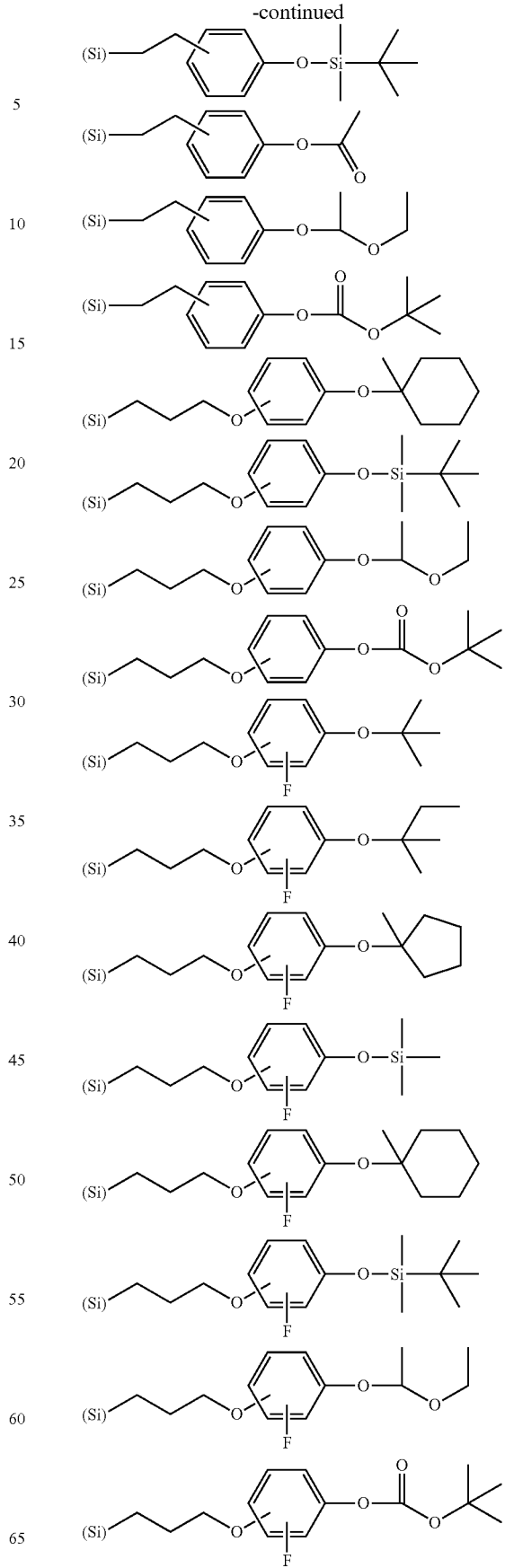

-continued
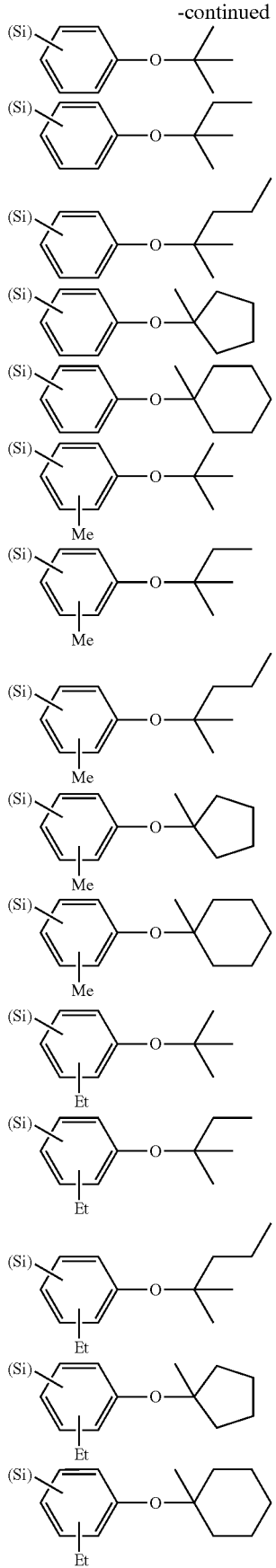
-continued
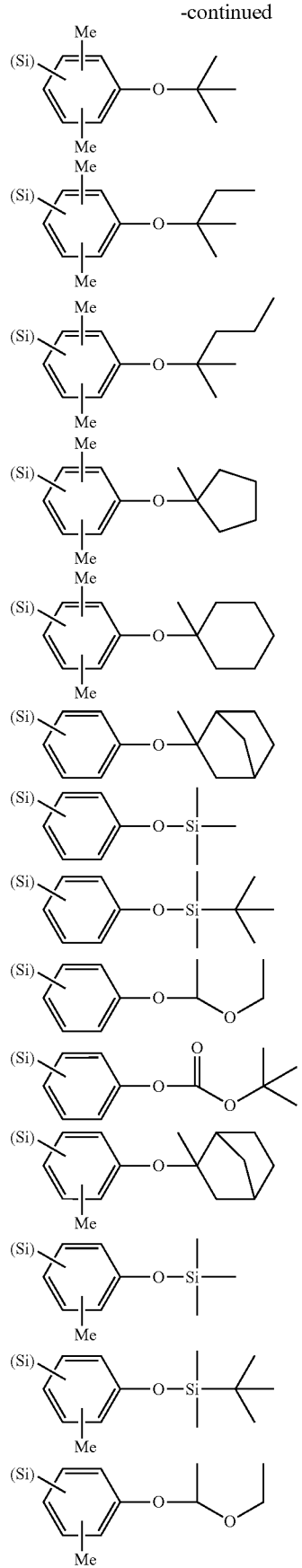

-continued

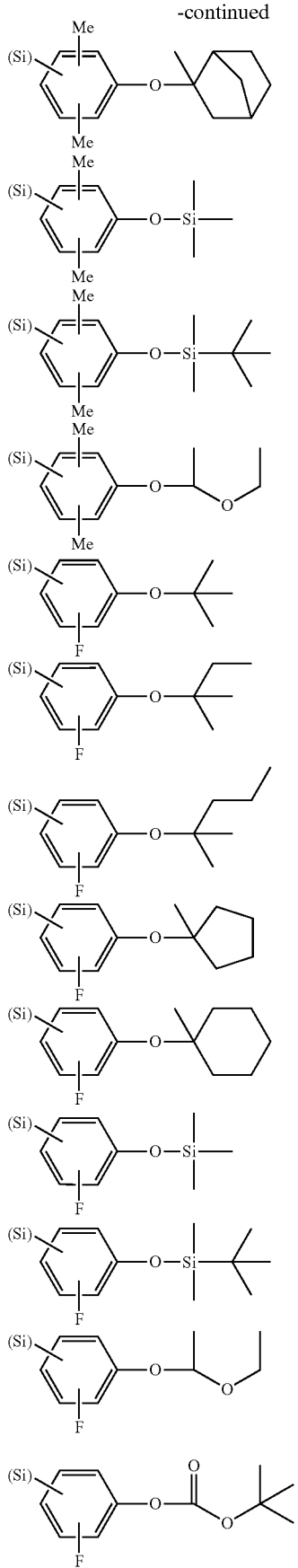

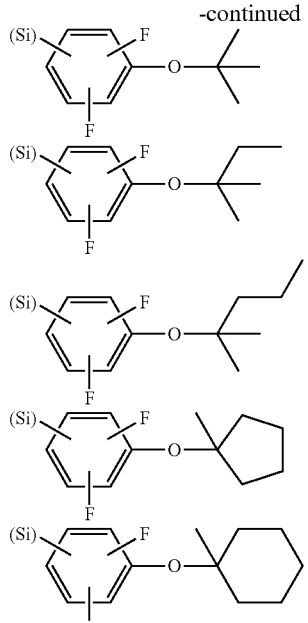

Also, as the raw material of the other component (C), one or more silicon compounds represented by the following formula (C-2) can be used:

$$Si(OR^{4C})_4 \qquad (C-2)$$

wherein $R^{4C}$ represents a hydrocarbon group having 1 to 6 carbon atoms.

The above-mentioned silicon compounds represented by the formula (C-2) may be exemplified by tetramethoxy silane, tetraethoxy silane, tetrapropoxy silane, tetraisopropoxy silane, etc.

The component (C) of the composition for forming a metal oxide-containing film of the present invention can be obtained by reacting one or more silicon compounds represented by the formula (C-1), or one or more silicon compounds represented by the formula (C-1) and one or more silicon compounds represented by the formula (C-2) by the same operation method as in the component (A).

By further containing such a component (C) in the composition for forming a metal oxide-containing film, when it is made a resist lower layer film, and when a pattern is formed, pattern adhesiveness can be further improved.

Other Components

The composition for forming a metal oxide-containing film of the present invention may further contain a photoacid generator. As the photoacid generator, the materials specifically described at the paragraphs [0160] to [0179] of Japanese Patent Laid-Open Publication No. 2009-126940 can be used.

The composition for forming a metal oxide-containing film of the present invention may further contain a thermal acid generator. As the thermal acid generator, the materials specifically described at the paragraphs [0061] to [0085] of Japanese Patent Laid-Open Publication No. 2007-199653 can be used.

As mentioned above, when the photoacid generator or the thermal acid generator is added to the composition for forming a metal oxide-containing film of the present invention, in addition to the above-mentioned characteristics, resolution of the pattern can be further improved.

The composition for forming a metal oxide-containing film of the present invention may further contain a crosslinking accelerator, if necessary.

Such a crosslinking accelerator may be exemplified by the compound shown by the following general formula (1) or (2):

  (1)

wherein K represents lithium, sodium, potassium, rubidium or cesium, X represents a hydroxyl group, or a monovalent or divalent or more of an organic acid group having 1 to 30 carbon atoms, "a" is an integer of 1 or more, "b" is 0 or an integer of 1 or more, and "a+b" is a valence number of the hydroxyl group or the organic acid group.

  (2)

wherein S represents a sulfonium, an iodonium or an ammonium, and Y represents a non-nucleophilic counter-ion.

Incidentally, the above crosslinking accelerator may be used a single kind alone or two or more kinds in combination.

To the composition for forming a metal oxide-containing film of the present invention may be further added a surfactant, if necessary. As such a surfactant, the materials specifically described at the paragraph [0129] of Japanese Patent Laid-Open Publication No. 2009-126940 can be used.

Patterning Process

The present invention is to provide a patterning process on a body to be processed, wherein, a metal oxide-containing film is formed on a body to be processed by using the composition for forming a metal oxide-containing film, a resist upper layer film is formed on the metal, oxide-containing film by using a resist upper layer film composition, the resist upper layer film is exposed to form a resist pattern, pattern transfer of the resist pattern is made onto the metal oxide-containing film, and then the body to be processed which is under the metal oxide-containing film is processed by etching by using the metal oxide-containing film having the transferred pattern as an etching mask patterning process.

Here, the body to be processed may be used that in which any of a metal film, a metal carbide film, a metal oxide film, a metal nitride film and a metal oxynitride film is formed on a semiconductor substrate as a layer to be processed (a portion to be processed), etc.

As the semiconductor substrate, a silicon substrate is generally used, which is not particularly limited, and that comprising a material different from the layer to be processed may be used such as Si, an amorphous silicon (α-Si), p-Si, $SiO_2$, SiN, SiON, W, TiN, Al, etc.

As the metal to constitute the body to be processed, there may be used any of silicon, titanium, tungsten, hafnium, zirconium, chromium, germanium, copper, aluminum, and iron, or an alloy of any of these metals. The layer to be processed containing the metal may be used, for example, Si, $SiO_2$, SiN, SiON, SiOC, p-Si, α-Si, TiN, WSi, BPSG, SOG, Cr, CrO, CrON, MoSi, W, W—Si, Al, Cu, Al—Si, etc., and various low dielectric film and an etching stopper film thereof, and can be generally formed with a thickness of 50 to 10,000 nm, in particular 100 to 5,000 nm.

In the patterning process of the present invention, any of a silicon-containing film, an organic film and an inorganic-carbon film is formed as an underlayer film on the body to be processed, and the metal oxide-containing film of the present invention may be formed on the film. Such an underlayer film is not particularly limited, and may be exemplified by a material which can show sufficient reflection preventive film function when exposure of the resist upper layer film is performed. By optimizing the combination of a silicon-containing film, an organic film and an inorganic-carbon film, a pattern formed by the resist upper layer film can be formed on the body to be processed without generating the difference in size conversion.

The composition for forming a metal oxide-containing film of the present invention can be coated by a spin coating method, etc., to form a film on the body to be processed or on the above-mentioned underlayer film. After spin coating, the solvent is evaporated, and baking is desirably performed to prevent from mixing with the resist upper layer film and to promote the cross-linking reaction. A baking temperature is preferably set in the range of 50 to 500° C. and performed for within 10 to 300 seconds. A particularly preferred temperature range may vary depending on the structure of the device to be produced, and preferably 400° C. or lower to reduce thermal damage of the device.

The resist upper layer film is not particularly limited, and may be exemplified by, for example, a chemical amplification type photoresist film. Also, in the patterning process of the present invention, a middle layer film may be formed between the resist upper layer film and the metal oxide-containing film, if necessary.

Exposure of the resist upper layer film is preferably performed any of the method of photolithography with the wavelength of 300 nm or less or an EUV beam, the method of a direct drawing with an electron beam, and the nanoimprint lithography method. When the lithography with a light having a wavelength of 300 nm or shorter or an EUV light is performed as mentioned above, fine pattern can be formed on the body to be processed, in particular, when the lithography with an EUV light is performed, a 32 node device can be manufactured.

Formation of the resist pattern may be performed by alkali developing the resist upper layer film after exposure to form a positive type pattern, or by developing with the organic solvent to form a negative type pattern.

A transfer method of the pattern to the metal oxide-containing film is not particularly limited, and may be exemplified by the method in which etching is performed by using gas mainly containing a gas containing fluorine or a fluoride such as a fluorocarbon series gas.

A transfer method of the pattern to the underlayer film comprising any of the silicon-containing film, the organic film and the inorganic-carbon film is not particularly limited, and may be exemplified by the method in which reactive dry etching is performed by the above-mentioned oxygen gas plasma.

In the patterning process of the present invention, it is preferred to contain the process of removing the metal oxide-containing film by aqueous ammonia containing hydrogen peroxide or hydrochloric acid containing hydrogen peroxide after pattern transferring to the under layer of the pattern transferred metal oxide-containing film. Thus, when the stripping conditioned using aqueous ammonia containing hydrogen peroxide or hydrochloric acid containing hydrogen peroxide, no damage is provided to the under layer, and the residue of the metal oxide-containing film can be performed under mild conditions.

The transfer method of the pattern to the body to be processed is not particularly limited, and may be exemplified by, for example, a method using fluorine series dry etching or chlorine series dry etching.

According to the composition for forming a metal oxide-containing film of the present invention, a resist lower layer film having high etching selectivity, capable of subjecting to stripping under mild conditions than the conventional process, and excellent in pattern adhesiveness can be provided. Also, according to the patterning process using the same, fine pattern formation can be performed.

EXAMPLES

In the following, the present invention is specifically explained by referring to Synthetic Examples and Examples, but the present invention is not limited by these descriptions. Incidentally, in the following Examples, % means % by mass, and the measurement of the molecular weight is performed by GPC.

Synthesis of Component (A)

Synthetic Example A-I

To a mixture comprising 28.4 g of titanium tetraisopropoxide, 50 g of isopropyl alcohol and 11.8 g of 2-(butylamino)ethanol was added dropwise a mixture comprising 2.7 g of pure water and 50 g of isopropyl alcohol. After completion of the dropwise addition, the mixture was stirred for 2 hours to perform hydrolysis condensation, and refluxed for further 2 hours. To the mixture was added 100 g of propylene glycol monomethyl ether acetate (PGMEA), and concentrated under reduced pressure to obtain 130 g of a PGMEA solution of a titanium-containing compound (A-I). The solid content concentration of the titanium-containing compound at this time was 13.5%.

Synthetic Example A-II

To a mixture comprising 32.7 g of zirconium tetraisopropoxide, 50 g of isopropyl alcohol and 50 g of acetylacetone was added dropwise a mixture comprising 2.7 g of pure water and 50 g of isopropyl alcohol. After completion of the dropwise addition, the mixture was stirred for 2 hours to perform hydrolysis condensation, and refluxed for further 2 hours. To the mixture was added 200 g of PGMEA, and the resulting mixture was concentrated under reduced pressure to obtain 250 g of a PGMEA solution of a zirconium-containing compound (A-II). The solid content concentration of the zirconium-containing compound at this time was 10.5%.

Synthetic Example A-III

To a mixture comprising 24.6 g of aluminum tributoxide, 60 g of isopropyl alcohol and 16 g of diethyl malonate was added dropwise a mixture comprising 1.8 g of pure water and 40 g of isopropyl alcohol. After completion of the dropwise addition, the mixture was stirred for 2 hours to perform hydrolysis condensation, and refluxed for further 2 hours. To the mixture was added 200 g of PGMEA, and the resulting mixture was concentrated under reduced pressure to obtain 150 g of a PGMEA solution of an aluminum-containing compound (A-III). The solid content concentration of the aluminum-containing compound at this time was 9.9%.

Synthetic Example A-IV

To a mixture comprising 12.3 g of aluminum tributoxide, 14.2 g of titanium tetraisopropoxide and 50 g of isopropyl alcohol was added dropwise a mixture comprising 2.0 g of pure water and 50 g of isopropyl alcohol. After completion of the dropwise addition, 20 g of acetylacetone was added to the resulting mixture, and the mixture was stirred for 2 hours to perform hydrolysis condensation, and refluxed for further 2 hours. To the mixture was added 100 g of PGMEA, and the resulting mixture was concentrated under reduced pressure to obtain 150 g of a PGMEA solution of an aluminum-titanium-containing compound (A-IV). The solid content concentration of the aluminum-titanium-containing compound at this time was 11.5%.

Synthetic Example A-V

To a mixture comprising 14.2 g of titanium tetraisopropoxide, 16.3 g of zirconium tetraisopropoxide and 50 g of isopropyl alcohol was added dropwise a mixture comprising 2.7 g of pure water and 50 g of isopropyl alcohol. After completion of the dropwise addition, 20 g of acetylacetone was added to the resulting mixture, and the mixture was stirred for 2 hours to perform hydrolysis condensation and further refluxed for 2 hours. To the mixture was added 150 g of PGMEA, and the resulting mixture was concentrated under reduced pressure to obtain 200 g of a PGMEA solution containing a titanium-zirconium-containing compound (A-V). The solid content concentration of the titanium-zirconium-containing compound at this time was 10.9%.

Synthetic Example A-VI

To a mixture comprising 12.3 g of aluminum tributoxide, 16.3 g of zirconium tetraisopropoxide and 50 g of isopropyl alcohol was added dropwise a mixture comprising 2.0 g of pure water and 50 g of isopropyl alcohol. After completion of the dropwise addition, 20 g of acetylacetone was added to the resulting mixture, and the mixture was stirred for 2 hours to perform hydrolysis condensation, and refluxed for further 2 hours. To the mixture was added 150 g of PGMEA, and the resulting mixture was concentrated under reduced pressure to obtain 200 g of a PGMEA solution of an aluminum-zirconium-containing compound (A-VI). The solid content concentration of the aluminum-zirconium-containing compound at this time was 11.1%.

Synthetic Example A-VII

To a mixture comprising 16.3 g of zirconium tetraisopropoxide, 28.7 g of hafnium 2,4-pentanedionate and 70 g of isopropyl alcohol was added dropwise a mixture comprising 2.2 g of pure water and 50 g of isopropyl alcohol. After completion of the dropwise addition, 50 g of acetylacetone was added to the resulting mixture, and the mixture was stirred for 2 hours to perform hydrolysis condensation, and refluxed for further 2 hours. To the mixture was added 200 g of PGMEA, and the resulting mixture was concentrated under reduced pressure to obtain 250 g of a PGMEA solution of a zirconium-hafnium-containing compound (A-VII). The solid content concentration of the zirconium-hafnium-containing compound at this time was 11.2%.

Synthesis of Component (B)

Synthetic Example B-I

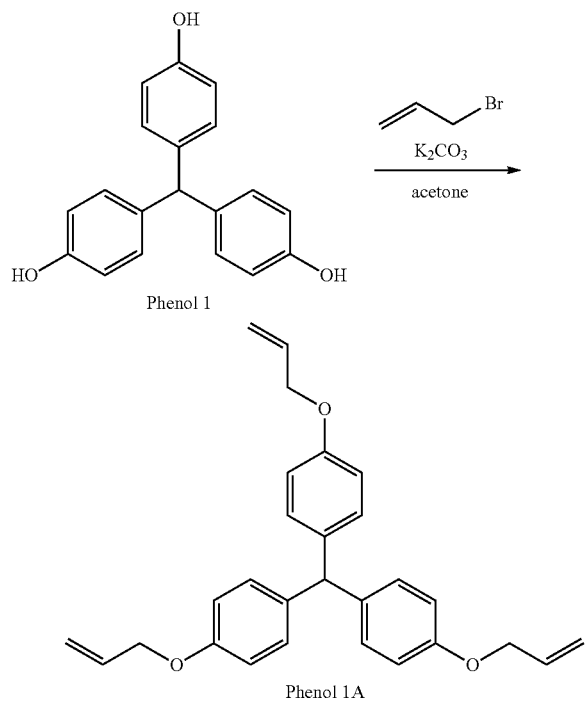

Phenol 1

Phenol 1A

A mixture comprising 100 g of phenol 1, 140 g of allyl bromide, 140 g of potassium carbonate and 300 g of acetone was stirred under nitrogen atmosphere under reflux conditions for 20 hours. After cooling to room temperature, 600 g of ethyl acetate and 850 g of pure water were added to the mixture, the resulting mixture was stirred, allowed to stand and the liquids were separated. To the obtained organic phase was added 200 g of pure water, and the resulting mixture was stirred, allowed to stand and the liquids were separated. This operation was repeated twice. The remained organic phase was concentrated under reduced pressure to obtain 131 g of phenol 1A as an aromatic compound (B-I).

Synthetic Example B-II

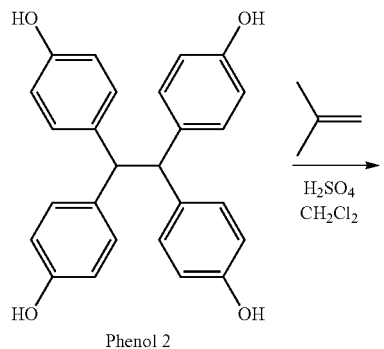

Phenol 2

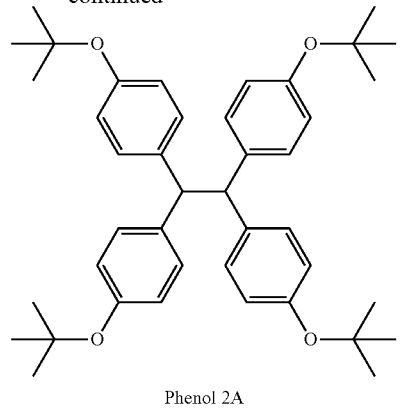

Phenol 2A 40 g of phenol 2 and 200 g of dichloromethane were mixed, and 0.8 g of strong sulfuric acid was added to the mixture. Subsequently, the mixture was subjected to bubbling of a 2-methylpropene gas at room temperature. After 8 hours, bubbling of a 2-methylpropene gas was stopped, and 5 g of 5% aqueous sodium hydroxide solution was added to the mixture to stop the reaction. After removing dichloromethane under reduced pressure, 300 g of diethyl ether and 50 g of 5% aqueous sodium hydroxide solution was added, and the resulting mixture was stirred, allowed to stand and the liquids were separated. This operation was repeated twice. The remained organic phase was concentrated under reduced pressure to obtain 62 g of phenol 2A as an aromatic compound (B-II).

Synthetic Example B-III

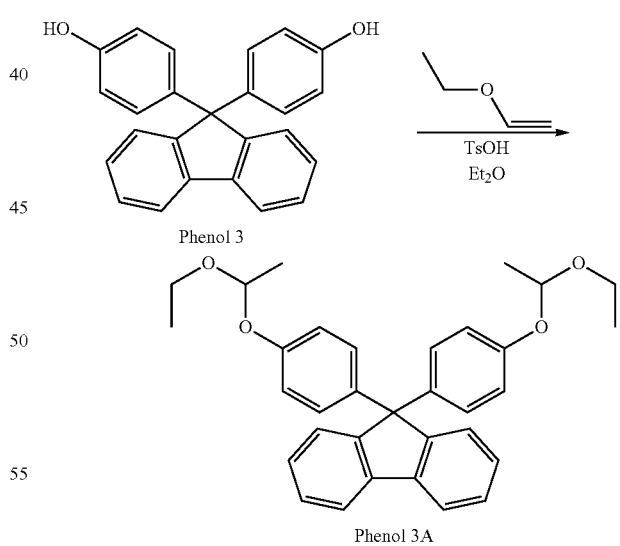

Phenol 3

Phenol 3A 35 g of phenol 3 and 350 g of diethyl ether were mixed, and 1 g of para-toluenesulfonic acid was added to the mixture. Subsequently, 15 g of ethyl vinyl ether was added to the mixture at 15° C. to 25° C. over 30 minutes. After stirring the mixture for further 30 minutes, 5 g of triethylamine was added thereto and then 50 g of 5% aqueous sodium hydroxide solution was added to the same, and the resulting mixture was stirred, allowed to stand and the liquids were separated. To the obtained organic phase was added 100 g of pure water, and the resulting mixture was stirred, allowed to stand and the liquids were separated. This operation was repeated twice. The remained organic phase was concentrated under reduced pressure to obtain 47 g of phenol 3A as an aromatic compound (B-III).

Synthetic Example B-IV

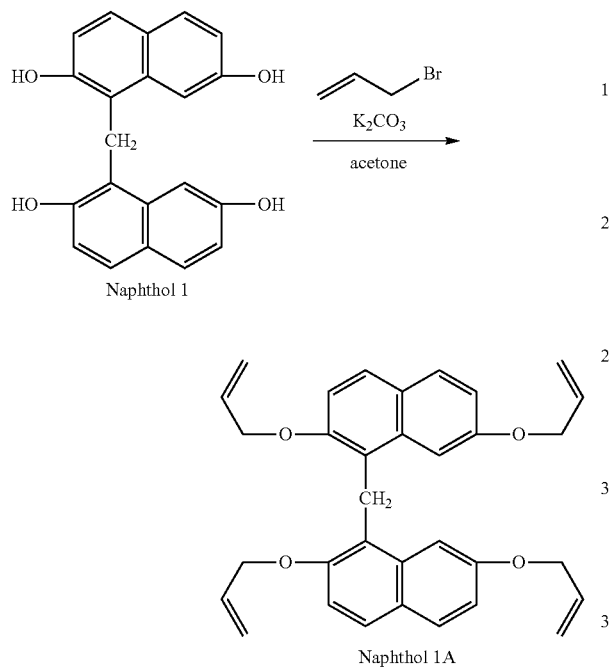

Naphthol 1

Naphthol 1A

A mixture comprising 33 g of naphthol 1, 55 g of allyl bromide, 60 g of potassium carbonate and 200 g of acetone was stirred under nitrogen atmosphere under reflux conditions for 20 hours. After cooling to room temperature, 400 g of ethyl acetate and 200 g of pure water were added to the mixture, and the resulting mixture was stirred, allowed to stand and the liquids were separated. To the obtained organic phase was added 100 g of pure water, and the resulting mixture was stirred, allowed to stand and the liquids were separated. This operation was repeated twice. The remained organic phase was concentrated under reduced pressure to obtain 44 g of naphthol 1A as an aromatic compound (B-IV).

Synthesis of Component (C)

Synthetic Example C-I

To a mixture comprising 200 g of methanol, 0.1 g of methanesulfonic acid and 60 g of deionized water was added 68.1 g of [Formula 101], and the resulting mixture was maintained at 40° C. for 12 hours, to carry out hydrolysis-condensation. After completion of the reaction, 200 g of propylene glycol methyl ether acetate (PGMEA) was added to the mixture, and the alcohol as a byproduct was distilled off under reduced pressure. To the resulting mixture were added 1000 ml of ethyl acetate and 300 g of PGMEA, and the aqueous layer was separated. To the remained organic layer was added 100 ml of ion exchanged water, and the resulting mixture was stirred, allowed to stand and the liquids were separated. This operation was repeated three times. The remained organic layer was concentrated under reduced pressure to obtain 170 g (compound concentration: 20%) of a PGMEA solution containing a silicon-containing compound (C-I). When the molecular weight of the obtained product in terms of the polystyrene was measured, it was Mw=2,200.

The procedures from [Synthetic Example C-II] to [Synthetic Example C-IV] were carried out by using the monomer shown in Table 1 under the same conditions as in Synthetic Example C-I to obtain objective products, respectively.

TABLE 1

| Synthetic Example | Reaction raw materials | Mw |
|---|---|---|
| C-I | [Formula 101]: 68.1 g | 2,200 |
| C-II | [Formula 100]: 19.8 g, [Formula 101]: 27.2 g, [Formula 102]: 30.4 g | 2,500 |
| C-III | [Formula 101]: 27.2 g, [Formula 102]: 22.8 g, [Formula 103]: 44.8 g | 2,400 |
| C-IV | [Formula 101]: 34.1 g, [Formula 102]: 15.2 g, [Formula 104]: 47.5 g | 2,800 |

PhSi(OCH$_3$)$_3$ [Formula 100]
CH$_3$Si(OCH$_3$)$_3$ [Formula 101]
Si(OCH$_3$)$_3$ [Formula 102]

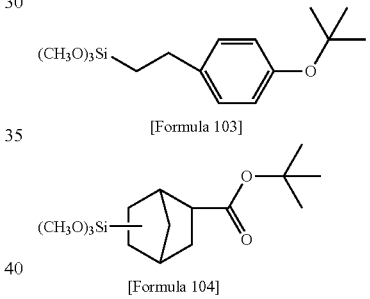

[Formula 103]

[Formula 104]

EXAMPLES

The metal oxide-containing compounds (A-I) to (A-VII) as the component (A), the aromatic compounds (B-I) to (B-IV) as the component (B), and the silicon-containing compounds (C-I) to (C-IV) as the component (C) each obtained in the above-mentioned Synthetic Examples, the solvents and the additives were mixed with the ratio shown in Table 2, and filtrated through the filter made of a fluorine resin with 0.1 μm to obtain the compositions for forming metal oxide-containing film solutions, respectively, and each was made Sols. 1 to 21.

TABLE 2

| No. | Component (A) Metal oxide-containing compound (Parts by mass) | Component (B) Aromatic compound (Parts by mass) | Component (C) Silicon-containing compound (Parts by mass) | Additive (Parts by mass) | Solvent (Parts by mass) |
|---|---|---|---|---|---|
| Sol. 1 | A-I (4.0) | B-I (0.4) | — | — | PGMEA (250) |

TABLE 2-continued

| No. | Component (A) Metal oxide-containing compound (Parts by mass) | Component (B) Aromatic compound (Parts by mass) | Component (C) Silicon-containing compound (Parts by mass) | Additive (Parts by mass) | Solvent (Parts by mass) |
|---|---|---|---|---|---|
| Sol. 2 | A-II (4.0) | B-I (0.4) | — | — | PGMEA (250) |
| Sol. 3 | A-III (4.0) | B-I (0.4) | — | — | PGMEA (250) |
| Sol. 4 | A-IV (4.0) | B-I (0.4) | — | — | PGMEA (250) |
| Sol. 5 | A-V (4.0) | B-I (0.4) | — | — | PGMEA (250) |
| Sol. 6 | A-VI (4.0) | B-I (0.4) | — | — | PGMEA (250) |
| Sol. 7 | A-VII (4.0) | B-I (0.4) | — | — | PGMEA (250) |
| Sol. 8 | A-I (2.0) A-II (2.0) | B-I (0.4) | — | — | PGMEA (250) |
| Sol. 9 | A-I (2.0) A-III (2.0) | B-I (0.4) | — | — | PGMEA (250) |
| Sol. 10 | A-I (2.0) A-IV (2.0) | B-I (0.4) | — | — | PGMEA (250) |
| Sol. 11 | A-I (2.0) A-V (2.0) | B-I (0.4) | — | — | PGMEA (250) |
| Sol. 12 | A-I (2.0) A-VI (2.0) | B-I (0.4) | — | — | PGMEA (250) |
| Sol. 13 | A-I (2.0) A-VII (2.0) | B-I (0.4) | — | — | PGMEA (250) |
| Sol. 14 | A-I (4.0) | B-II (0.4) | — | TEANf (0.1) | PGMEA (250) |
| Sol. 15 | A-I (4.0) | B-III (0.4) | — | — | PGMEA (250) |
| Sol. 16 | A-I (4.0) | B-IV (0.4) | — | — | PGMEA (250) |
| Sol. 17 | A-I (4.0) | B-I (0.4) | C-I (0.1) | TPSMA (0.01) | PGMEA (250) |
| Sol. 18 | A-I (4.0) | B-II (0.4) | C-II (0.1) | TPSMA (0.01) | PGMEA (250) |
| Sol. 19 | A-I (4.0) | B-III (0.4) | C-III (0.1) | TPSMA (0.01) | PGMEA (250) |
| Sol. 20 | A-I (4.0) | B-IV (0.4) | C-IV (0.1) | TPSMA (0.01) | PGMEA (250) |
| Sol. 21 | A-V (4.0) | B-I (0.4) | C-I (0.1) | TPSMA (0.01) | PGMEA (250) |

TEANf: Triethylammonium nonafluorobutane sulfonate
TPSMA: Mono(triphenyl sulfonium) maleate Coating Film Wet Etching Test The compositions for forming metal oxide-containing films Sols. 1 to 21 were each rotary coated on a silicon wafer, and heated at 350° C. for 1 minute for Sols. 1 to 16, and heated at 250° C. for 1 minute for Sols. 17 to 21 to form a film to prepare each metal oxide-containing film having a film thickness of 35 nm. These films were dipped in 1% aqueous hydrogen peroxide containing 0.6% ammonia (hereinafter referred to as "ammonia per-water") and 1% aqueous hydrogen peroxide containing 0.7% hydrochloric acid (hereinafter referred to as "hydrochloric acid per-water") at 23° C. for 10 minutes, and the thickness of the film remained was measured by M-2000 high-speed spectrum ellipsometer manufactured by JA Woollam Co., Inc. The results are shown in Table 3.

TABLE 3

| | Ammonia per-water | | Hydrochloric acid per-water | |
|---|---|---|---|---|
| NO. | Film thickness before treatment (A) | Film thickness after treatment (A) | Film thickness before treatment (A) | Film thickness after treatment (A) |
| Sol. 1 | 350 | 2 or less | 357 | 2 or less |
| Sol. 2 | 346 | 2 or less | 358 | 2 or less |
| Sol. 3 | 356 | 2 or less | 355 | 2 or less |
| Sol. 4 | 357 | 2 or less | 355 | 2 or less |
| Sol. 5 | 340 | 2 or less | 341 | 2 or less |
| Sol. 6 | 354 | 2 or less | 356 | 2 or less |
| Sol. 7 | 355 | 2 or Jess | 352 | 2 or less |
| Sol. 8 | 359 | 2 or less | 342 | 2 or less |
| Sol. 9 | 355 | 2 or less | 354 | 2 or less |
| Sol. 10 | 345 | 2 or less | 355 | 2 or less |
| Sol. 11 | 349 | 2 or less | 353 | 2 or less |
| Sol. 12 | 344 | 2 or less | 355 | 2 or less |
| Sol. 13 | 353 | 2 or less | 358 | 2 or less |
| Sol. 14 | 347 | 2 or less | 360 | 2 or less |
| Sol. 15 | 345 | 2 or less | 360 | 2 or less |
| Sol. 16 | 352 | 2 or less | 345 | 2 or less |
| Sol. 17 | 351 | 2 or less | 341 | 2 or less |
| Sol. 18 | 347 | 2 or less | 344 | 2 or less |
| Sol. 19 | 360 | 2 or less | 350 | 2 or less |
| Sol. 20 | 355 | 2 or less | 355 | 2 or less |
| Sol. 21 | 352 | 2 or less | 347 | 2 or less |

As shown in Table 3, in any of the metal oxide-containing films, wet stripping can be carried out.

Positive Type Development Patterning Test (1)

On 12 inches wafer on which 100 nm of a CVD carbon film has been formed was rotary coated each of Sols. 1 to 16, and heated at 350° C. for 1 minute to form a film to prepare coating films of Films 1 to 16 each having a film thickness of 35 nm. Further, a spin on carbon film ODL-50 (carbon content: 80% by mass) available from Shin-Etsu Chemical Co., Ltd., was formed by heating at 300° C. for 1 minute to form a film having a film thickness of 100 nm. A silicon-containing resist lower layer film SHB-A940 (silicon-containing amount: 43% by mass) available from Shin-Etsu Chemical Co., Ltd., was coated thereon and heated at 240° C. for 60 seconds to prepare a silicon-containing film having a film thickness of 35 nm. Subsequently, an ArF resist solution (PR-1) for positive development shown in Table 4 was coated on the said film, and baked at 110° C. for 60 seconds to form a photoresist layer having a film thickness of 100 nm. Further, a liquid immersion protective film (TC-1) shown in Table 5 was coated on the photoresist film, and baked at 90° C. for 60 seconds to prepare a protective film having a film thickness of 50 nm. Then, the resulting material was exposed by an ArF liquid immersion exposure apparatus (NSR-S610C manufactured by Nikon Corporation, NA: 1.30, σ: 0.98/0.65, 35° dipole polarized illumination, 6% halftone phase shift mask), baked (PEB) at 100° C. for 60 seconds, and developed by a 2.38% by mass aqueous tetramethylammonium hydroxide (TMAH) solution for 30 seconds to obtain 45 nm 1:1 positive type line and space pattern.

Subsequently, pattern collapse was measured by an electron microscope (CG4000) manufactured by Hitachi High-Technologies Corporation, and a cross-sectional profile was measured by an electron microscope (S-9380) manufactured by Hitachi Ltd. The results are shown in Table 6.

TABLE 4

| No. | Polymer (Parts by mass) | Acid generator (Parts by mass) | Base (Parts by mass) | Solvent (Parts by mass) |
|---|---|---|---|---|
| PR-1 | P1 (100) | PAG1 (7.0) | Q1 (1.0) | PGMEA (2500) |

ArF resist polymer: P1

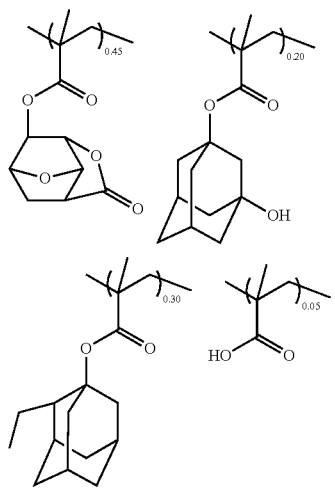

Molecular weight (Mw) = 7,800
Degree of dispersion (Mw/Mn) = 1.78
Acid generator: PAG1

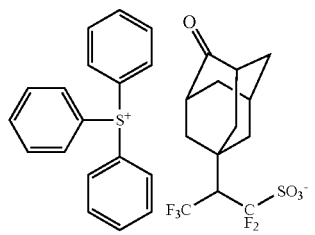

Base: Q1

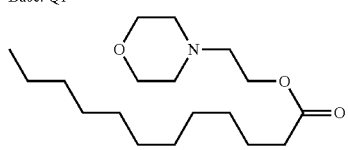

TABLE 5

| | Polymer (Parts by mass) | Solvent (Parts by mass) |
|---|---|---|
| TC-1 | P2 (100) | Diisoamyl ether (2700) 2-Methyl-1-butanol (270) |

Protective film polymer: P2
Molecular weight (Mw) = 8,800
Degree of dispersion (Mw/Mn) = 1.69

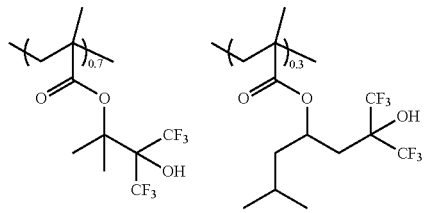

TABLE 6

| Example | Metal oxide-containing film | Pattern profile of cross section after development | Pattern collapse |
|---|---|---|---|
| Example 1-1 | Film 1 | Vertical profile | None |
| Example 1-2 | Film 2 | Vertical profile | None |
| Example 1-3 | Film 3 | Vertical profile | None |
| Example 1-4 | Film 4 | Vertical profile | None |
| Example 1-5 | Film 5 | Vertical profile | None |
| Example 1-6 | Film 6 | Vertical profile | None |
| Example 1-7 | Film 7 | Vertical profile | None |
| Example 1-8 | Film 8 | Vertical profile | None |
| Example 1-9 | Film 9 | Vertical profile | None |
| Example 1-10 | Film 10 | Vertical profile | None |
| Example 1-11 | Film 11 | Vertical profile | None |
| Example 1-12 | Film 12 | Vertical profile | None |
| Example 1-13 | Film 13 | Vertical profile | None |
| Example 1-14 | Film 14 | Vertical profile | None |
| Example 1-15 | Film 15 | Vertical profile | None |
| Example 1-16 | Film 16 | Vertical profile | None |

As shown in Table 6, in the positive development, a pattern which had a vertical profile of cross section and did not collapse by the line width of 45 nm could be obtained in the respective Examples.

The resist patterns prepared by the above-mentioned patterning test were each used as a mask, the processing of the silicon-containing film was performed by dry etching under Conditions (1), then, dry etching under Conditions (2) to transfer the pattern to the spin on carbon film, further the processing of the metal oxide-containing film was performed by dry etching under Conditions (3), and finally dry etching under Conditions (4) to transfer the pattern to the CVD carbon film. The obtained pattern was dipped in an ammonia perwater at 23° C. for 20 minutes to remove the metal oxide-containing film remained after the dry etching by the wet stripping method. A cross-sectional profile of the obtained CVD carbon pattern was measured by an electron microscope (S-9380) manufactured by Hitachi Ltd. The results are shown in Table 7.

Etching Conditions with $CHF_3/CF_4$ Series Gas

Instrument: Dry etching instrument Telius SP manufactured by Tokyo Electron Limited Etching Conditions (1):

| Chamber pressure | 10 Pa |
|---|---|
| Upper/Lower RF Power | 500 W/300 W |
| $CHF_3$ gas flow rate | 150 ml/min |
| $CF_4$ gas flow rate | 100 ml/min |
| Ar gas flow rate | 100 ml/min |
| Treatment time | 30 sec |

Etching Conditions (2):

| Chamber pressure | 2 Pa |
|---|---|
| Upper/Lower RF power | 1000 W/300 W |
| $O_2$ gas flow rate | 300 ml/min |
| $N_2$ gas flow rate | 100 ml/min |
| Ar gas flow rate | 100 ml/min |
| Treatment time | 30 sec |

Etching Conditions (3):

| | |
|---|---|
| Chamber pressure | 15 Pa |
| Upper/Lower RF power | 500 W/300 W |
| CF$_4$ gas flow rate | 200 ml/min |
| Ar gas flow rate | 100 ml/min |
| Treatment time | 40 sec |

Etching Conditions (4):

| | |
|---|---|
| Chamber pressure | 5 Pa |
| Upper/Lower RF power | 1000 W/300 W |
| O$_2$ gas flow rate | 300 ml/min |
| N$_2$ gas flow rate | 100 ml/min |
| Ar gas flow rate | 100 ml/min |
| Treatment time | 30 sec |

TABLE 7

| No | Metal oxide-containing film pattern | CVD carbon pattern profile of cross section | CVD carbon pattern section size |
|---|---|---|---|
| Film 1 | No residue | Vertical profile | 31 nm |
| Film 2 | No residue | Vertical profile | 30 nm |
| Film 3 | No residue | Vertical profile | 32 nm |
| Film 4 | No residue | Vertical profile | 30 nm |
| Film 5 | No residue | Vertical profile | 31 nm |
| Film 6 | No residue | Vertical profile | 31 nm |
| Film 7 | No residue | Vertical profile | 30 nm |
| Film 8 | No residue | Vertical profile | 30 nm |
| Film 9 | No residue | Vertical profile | 30 nm |
| Film 10 | No residue | Vertical profile | 31 nm |
| Film 11 | No residue | Vertical profile | 29 nm |
| Film 12 | No residue | Vertical profile | 30 nm |
| Film 13 | No residue | Vertical profile | 30 nm |
| Film 14 | No residue | Vertical profile | 29 nm |
| Film 15 | No residue | Vertical profile | 31 nm |
| Film 16 | No residue | Vertical profile | 31 nm |

As shown in Table 7, it could be understood that the metal oxide-containing films according to the present invention were each acted as a wet-strippable hard mask for processing a CVD carbon film.

Positive Type Development Patterning Test (2)

On 12 inches wafer on which 100 nm CVD carbon film had been formed was each rotary coated Sols. 17 to 21, and heated at 250° C. for 1 minute to form a film to prepare coating films of Films 17 to 21 each having a film thickness of 35 nm. Subsequently, an ArF resist solution (PR-1) for positive development shown in Table 4 was coated on the said film, and baked at 110° C. for 60 seconds to form a photoresist layer having a film thickness of 100 nm. Further, a liquid immersion protective film (TC-1) shown in Table 5 was coated on the photoresist film and baked at 90° C. for 60 seconds to form a protective film having a film thickness of 50 nm. Then, the resulting material was exposed by an ArF liquid immersion exposure apparatus (NSR-S610C manufactured by Nikon Corporation, NA: 1.30, σ: 0.98/0.65, 35° dipole polarized illumination, 6% halftone phase shift mask), baked (PEB) at 100° C. for 60 seconds, and developed by a 2.38% by mass aqueous tetramethylammonium hydroxide (TMAH) solution for 30 seconds to obtain 50 nm 1:1 positive type line and space pattern. Subsequently, pattern collapse was measured by an electron microscope (CG4000) manufactured by Hitachi High-Technologies Corporation, and a cross-sectional profile was measured by an electron Microscope (S-9380) manufactured by Hitachi Ltd. The results are shown in Table 8.

TABLE 8

| Example | Metal oxide-containing film | Pattern profile of cross section after development | Pattern collapse |
|---|---|---|---|
| Example 1-17 | Film 17 | Vertical profile | None |
| Example 1-18 | Film 18 | Vertical profile | None |
| Example 1-19 | Film 19 | Vertical profile | None |
| Example 1-20 | Film 20 | Vertical profile | None |
| Example 1-21 | Film 21 | Vertical profile | None |

As shown in Table 8, in the positive development, a pattern which had a vertical profile of cross-section and did not collapse by the line width of 50 nm could be obtained in the respective Examples.

The resist patterns prepared by the above-mentioned patterning test were each used as a mask, the processing of the resist lower layer film was performed by dry etching under Conditions (5), then, dry etching under Conditions (6) to transfer the pattern to the CVD carbon film. The obtained pattern was dipped in an ammonia per-water at 23° C. for 20 minutes to remove the metal oxide-containing film remained after the dry etching by the wet stripping method. A cross-sectional profile of the obtained CVD carbon pattern was measured by an electron microscope (S-9380) manufactured by Hitachi Ltd. The results are shown in Table 9.

Etching Conditions with CHF$_3$/CF$_4$ Series Gas

Instrument: Dry etching instrument Telius SP manufactured by Tokyo Electron Limited Etching Conditions (5):

| | |
|---|---|
| Chamber pressure | 15 Pa |
| Upper/Lower RF power | 500 W/300 W |
| CF$_4$ gas flow rate | 200 ml/min |
| Ar gas flow rate | 100 ml/min |
| Treatment time | 40 sec |

Etching Conditions (6):

| | |
|---|---|
| Chamber pressure | 5 Pa |
| Upper/Lower RF power | 1000 W/300 W |
| O$_2$ gas flow rate | 300 ml/min |
| N$_2$ gas flow rate | 100 ml/min |
| Ar gas flow rate | 100 ml/min |
| Treatment time | 30 sec |

TABLE 9

| No | Metal oxide-containing film pattern | CVD carbon pattern profile of cross section | CVD carbon pattern section size |
|---|---|---|---|
| Film 17 | No residue | Vertical profile | 49 nm |
| Film 18 | No residue | Vertical profile | 48 nm |
| Film 19 | No residue | Vertical profile | 50 nm |
| Film 20 | No residue | Vertical profile | 49 nm |
| Film 21 | No residue | Vertical profile | 49 nm |

As shown in Table 9, it could be found out that the metal oxide-containing films according to the present invention acted as a wet-strippable hard mask for processing a CVD carbon film in the positive development.

Negative Type Development Patterning Test

On a silicon wafer was formed a spin on carbon film ODL-50 (carbon content: 80% by mass) available from Shin-Etsu Chemical Co., Ltd., with a film thickness of 200 nm. The compositions for forming metal oxide-containing films Sols.

17 to 21 were each coated thereon and heated at 250° C. for 60 seconds to prepare resist lower layer films: Films 22 to 26 comprising a metal oxide-containing film having a film thickness of 35 nm. Subsequently, an ArF resist solution (PR-2) for negative development shown in Table 10 was coated on the said resist lower layer film, and baked at 100° C. for 60 seconds to form a photoresist layer having a film thickness of 100 nm. Further, a liquid immersion protective film (TC-1) shown in Table 5 was coated on the photoresist film and baked at 90° C. for 60 seconds to form a protective film having a film thickness of 50 nm. Then, the resulting material was exposed by an ArF liquid immersion exposure apparatus (NSR-S610C manufactured by Nikon Corporation, NA: 1.30, σ: 0.98/0.65, dipole polarized illumination, 6% halftone phase shift mask) and baked (PEB) at 100° C. for 60 seconds, butyl acetate was discharged for 3 seconds as a developing solution from a developing nozzle while rotating the material with 30 rpm, thereafter rotation was stopped and paddle development was performed for 27 seconds, the material was rinsed with diisoamyl ether and then spin dried, and baked at 100° C. for 20 seconds to evaporate the rinsing solvent. According to this patterning, 50 nm 1:1 negative type line and space pattern could be obtained. Subsequently, pattern collapse was measured by an electron microscope (CG4000) manufactured by Hitachi High-Technologies Corporation, and a cross-sectional profile was measured by an electron microscope (S-9380) manufactured by Hitachi Ltd. The results are shown in Table 11.

TABLE 10

| No. | Polymer (Parts by mass) | Acid generator (Parts by mass) | Base (Parts by mass) | Solvent (Parts by mass) |
|---|---|---|---|---|
| PR-2 | P3 (100) | PAG1 (7.0) | Q1 (1.0) | PGMEA (2500) |

ArF resist polymer: P3

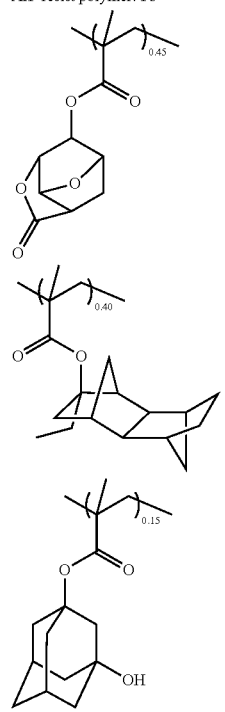

Molecular weight (Mw) = 8,600
Degree of dispersion (Mw/Mn) = 1.88

TABLE 11

| Example | Metal oxide-containing film | Pattern profile of cross section after development | Pattern collapse |
|---|---|---|---|
| Example 2-1 | Film 22 | Vertical profile | None |
| Example 2-2 | Film 23 | Vertical profile | None |
| Example 2-3 | Film 24 | Vertical profile | None |
| Example 2-4 | Film 25 | Vertical profile | None |
| Example 2-5 | Film 26 | Vertical profile | None |

As shown in Table 11, in the negative development, a pattern which had a vertical profile of cross section and did not collapse by the line width of 50 nm could be also obtained in the respective Examples.

The resist patterns prepared by the above-mentioned patterning test were each used as a mask, the processing of the resist lower layer film was performed by dry etching under Conditions (7), then, dry etching under Conditions (8) to transfer the pattern to the CVD carbon film. The obtained pattern was dipped in an ammonia per-water at 23° C. for 20 minutes to remove the metal oxide-containing film remained after the dry etching by the wet stripping method. A cross-sectional profile of the obtained CVD carbon pattern was measured by an electron microscope (S-9380) manufactured by Hitachi Ltd. The results are shown in Table 12.

Etching Conditions with $CHF_3/CF_4$ Series Gas
Instrument: Dry etching instrument Telius SP manufactured by Tokyo Electron Limited
Etching Conditions (7):

| Chamber pressure | 15 Pa |
|---|---|
| Upper/Lower RF power | 500 W/300 W |
| $CF_4$ gas flow rate | 200 ml/min |
| Ar gas flow rate | 100 ml/min |
| Treatment time | 40 sec |

Etching Conditions (8):

| Chamber pressure | 5 Pa |
|---|---|
| Upper/Lower RF power | 1000 W/300 W |
| $O_2$ gas flow rate | 300 ml/min |
| $N_2$ gas flow rate | 100 ml/min |
| Ar gas flow rate | 100 ml/min |
| Treatment time | 30 sec |

TABLE 12

| No | Metal oxide-containing film pattern | CVD carbon pattern profile of cross section | CVD carbon pattern section size |
|---|---|---|---|
| Film 22 | No residue | Vertical profile | 50 nm |
| Film 23 | No residue | Vertical profile | 49 nm |
| Film 24 | No residue | Vertical profile | 49 nm |
| Film 25 | No residue | Vertical profile | 49 nm |
| Film 26 | No residue | Vertical profile | 50 nm |

As shown in Table 12, it could be found out that the metal oxide-containing films according to the present invention acted as a wet-strippable hard mask for processing a CVD carbon film also in the negative development.

According to the above, it could be found out that the composition for forming a metal oxide-containing film can form a resist lower layer film which can be used in both of the positive development and the negative development, and the resist lower layer film using the same acted as a wet-strippable hard mask for processing a CVD carbon film.

From the above-mentioned results, it could be clarified when the composition for forming a metal oxide-containing film of the present invention is used, a resist lower layer film stripping of which can be performed under mild conditions than those of the conventional processes, excellent in pattern adhesiveness, and can form a fine pattern can be provided.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. A composition for forming a metal oxide-containing film comprising:
   (i) as a component (A), a metal oxide-containing compound $A_1$ obtained by hydrolysis and/or condensation of one or more kinds of hydrolysable metal compounds wherein the hydrolysable metal compounds are represented by the following general formula (A-1), $$L(OR^{0A})_{a0}(OR^{1A})_{a1}(O)_{a2} \tag{A-1}$$

wherein, $R^{0A}$ and $R^{1A}$ represent an organic group having 1 to 30 carbon atoms; a0, a1 and a2 represent an integer of 0 or more, at least one of a0 and a1 is 1 or more, and a0+a1+2×a2 is the same number as the number determined by valency of L; L is any of aluminum, gallium, yttrium, titanium, zirconium, hafnium, bismuth, tin, vanadium, and tantalum, and (ii) as a component (B), an aromatic compound represented by the following general formula (B-1), wherein the aromatic compound is capable of generating a hydroxyl group by exposure to heat and/or an acid,

wherein, d1 and d3 represent an integer of 1, 2 or 3; d2 represents an integer of 0, 1 or 2; E and G represent a single bond or a divalent organic group composed of one or more of carbon, oxygen and hydrogen atom; each $D^1$, $D^2$ and $D^3$ may be the same or different and represents an organic group shown by the following general formula (B-1a) or (B-1b),

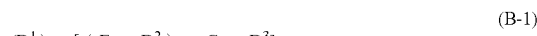

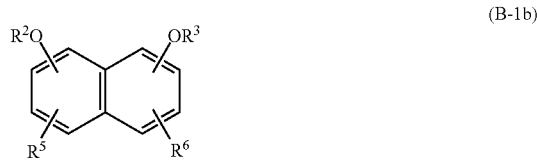

wherein, each $R^1$, $R^2$ and $R^3$ may be the same or different and represents an organic group shown by the following general formula (B-1c), (B-1d) or (B-1e); each $R^4$, $R^5$ and $R^6$ may be the same or different and represents a hydrogen atom or an alkyl group having 1 to 20 carbon atoms, and two alkyl groups may be bonded to form a cyclic substituent.

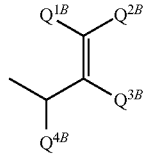

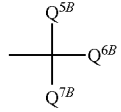

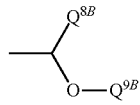

wherein, $Q^{1B}$ to $Q^{4B}$ represent a hydrogen atom or an alkyl group having 1 to 20 carbon atoms, and two substituents arbitrarily selected from $Q^{1B}$ to $Q^{4B}$ may be bonded to form a cyclic substituent; $Q^{5B}$ to $Q^{7B}$ represent an alkyl group having 1 to 20 carbon atoms, and two substituents arbitrarily selected from $Q^{5B}$ to $Q^{7B}$ may be bonded to form a cyclic substituent; and $Q^{8B}$ and $Q^{9B}$ represent an alkyl group having 1 to 20 carbon atoms, and $Q^{8B}$ and $Q^{9B}$ may be bonded each other to form a cyclic substituent.

2. The composition for forming a metal oxide-containing film according to claim 1, wherein the component (A) contains a metal oxide-containing compound $A_2$ obtained by hydrolysis and/or condensation of one or more first kinds of hydrolysable metal compounds and one or more second kinds of hydrolysable metal compounds wherein the one or more first kinds of hydrolysable metal compounds are represented by the general formula (A-1) and the one or more second kinds of hydrolysable metal compounds are represented by the following general formula (A-2), $$M(OR^{3A})_{a3}OR^{4A})_{a4}(O)_{a5} \tag{A-2}$$

wherein, $R^{3A}$ and $R^{4A}$ represent an organic group having 1 to 10 carbon atoms; a3, a4 and a5 represent an integer of 0 or more, at least one of a3 and a4 is 1 or more, and a3+a4+2×a5 is the same number as the number determined by valency of M; and the M is an element belonging to groups of III, IV, or V in a periodic table except for carbon and is an element different from L.

3. The composition for forming a metal oxide-containing film according to claim 2, wherein the composition for forming a metal oxide-containing film further comprises an acid and/or a thermal acid generator.

4. The composition for forming a metal oxide-containing film according to claim 2, wherein the component (A) is a mixture of the metal oxide-containing compound $A_1$ and the metal oxide-containing compound $A_2$.

5. The composition for forming a metal oxide-containing film according to claim 4, wherein the composition for forming a metal oxide-containing film further comprises an acid and/or a thermal acid generator.

6. The composition for forming a metal oxide-containing film according to claim 4, wherein the composition for forming a metal oxide-containing film further comprises, as a component (C), a silicon-containing compound obtained by hydrolysis and/or condensation of one or more kinds of silicon compounds wherein the silicon compounds are represented by the following general formula (C-1), $$R^{1C}{}_{c1}R^{2C}{}_{c2}R^{3C}{}_{c3}Si(OR^{0C})_{(4-c1-c2-c3)} \tag{C-1}$$

wherein, $R^{OC}$ represents a hydrocarbon group having 1 to 6 carbon atoms; $R^{1C}$, $R^{2C}$ and $R^{3C}$ represent a hydrogen atom or an organic group having 1 to 30 carbon atoms; and c1, c2 and c3 represent 0 or 1 and satisfy $1 \leq c1+c2+c3 \leq 3$.

7. The composition for forming a metal oxide-containing film according to claim 6, wherein the component (C) is a silicon-containing compound obtained by hydrolysis and/or condensation of a mixture containing one or more kinds of silicon compounds represented by the general formula (C-1) and one or more kinds of silicon compounds represented by the following general formula (C-2) that are different from the one or more kinds of silicon compounds represented by the general formula (C-1),

$$Si(OR^{4C})_4 \quad (C-2)$$

wherein, $R^{4C}$ represents a hydrocarbon group having 1 to 6 carbon atoms.

8. The composition for forming a metal oxide-containing film according to claim 6, wherein any one or more of $R^{1C}$, $R^{2C}$ and $R^{3C}$ in the general formula (C-1) is an organic group containing a hydroxyl group or a carboxyl group, the groups being substituted with an acid-labile group.

9. The composition for forming a metal oxide-containing film according to claim 2, wherein the composition for forming a metal oxide-containing film further comprises, as a component (C), a silicon-containing compound obtained by hydrolysis and/or condensation of one or more kinds of silicon compounds wherein the silicon compounds are represented by the following general formula (C-1), $$R^{1C}_{c1}R^{2C}_{c2}R^{3C}_{c3}Si(OR^{OC})_{(4-c1-c2-c3)} \quad (C-1)$$

wherein, $R^{OC}$ represents a hydrocarbon group having 1 to 6 carbon atoms; $R^{1C}$, $R^{2C}$ and $R^{3C}$ represent a hydrogen atom or an organic group having 1 to 30 carbon atoms; and c1, c2 and c3 represent 0 or 1 and satisfy $1 \leq c1+c2+c3 \leq 3$.

10. The composition for forming a metal oxide-containing film according to claim 9, wherein the component (C) is a silicon-containing compound obtained by hydrolysis and/or condensation of a mixture containing one or more kinds of silicon compounds represented by the general formula (C-1) and one or more kinds of silicon compounds represented by the following general formula (C-2) that are different from the one or more kinds of silicon compounds represented by the general formula (C-1),

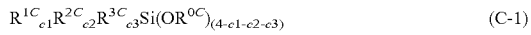
$$Si(OR^{4C})_4 \quad (C-2)$$

wherein, $R^{4C}$ represents a hydrocarbon group having 1 to 6 carbon atoms.

11. The composition for forming a metal oxide-containing film according to claim 9, wherein any one or more of $R^{1C}$, $R^{2C}$ and $R^{3C}$ in the general formula (C-1) is an organic group containing a hydroxyl group or a carboxyl group, the groups being substituted with an acid-labile group.

12. The composition for forming a metal oxide-containing film according to claim 1, wherein the component (A) is a mixture of the metal oxide-containing compound $A_1$ and a metal oxide-containing compound $A_3$ obtained by hydrolysis and/or condensation of one or more kinds of hydrolysable metal compounds shown by the general formula (A-2).

13. The composition for forming a metal oxide-containing film according to claim 12, wherein the composition for forming a metal oxide-containing film further comprises, as a component (C), a silicon-containing compound obtained by hydrolysis and/or condensation of one or more kinds of silicon compounds wherein the silicon compounds are represented by the following general formula (C-1),

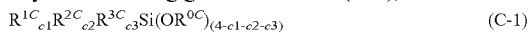
$$R^{1C}_{c1}R^{2C}_{c2}R^{3C}_{c3}Si(OR^{OC})_{(4-c1-c2-c3)} \quad (C-1)$$

wherein, $R^{OC}$ represents a hydrocarbon group having 1 to 6 carbon atoms; $R^{1C}$, $R^{2C}$ and $R^{3C}$ represent a hydrogen atom or an organic group having 1 to 30 carbon atoms; and c1, c2 and c3 represent 0 or 1 and satisfy $1 \leq c1+c2+c3 \leq 3$.

14. The composition for forming a metal oxide-containing film according to claim 13, wherein the component (C) is a silicon-containing compound obtained by hydrolysis and/or condensation of a mixture containing one or more kinds of silicon compounds represented by the general formula (C-1) and one or more kinds of silicon compounds represented by the following general formula (C-2) that are different from the one or more kinds of silicon compounds represented by the general formula (C-1),

$$Si(OR^{4C})_4 \quad (C-2)$$

wherein, $R^{4C}$ represents a hydrocarbon group having 1 to 6 carbon atoms.

15. The composition for forming a metal oxide-containing film according to claim 13, wherein any one or more of $R^{1C}$, $R^{2C}$ and $R^{3C}$ in the general formula (C-1) is an organic group containing a hydroxyl group or a carboxyl group, the groups being substituted with an acid-labile group.

16. The composition for forming a metal oxide-containing film according to claim 12, wherein the composition for forming a metal oxide-containing film further comprises an acid and/or a thermal acid generator.

17. The composition for forming a metal oxide-containing film according to claim 1, wherein the composition for forming a metal oxide-containing film further comprises, as a component (C), a silicon-containing compound obtained by hydrolysis and/or condensation of one or more kinds of silicon compounds wherein the silicon compounds are represented by the following general formula (C-1),

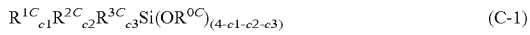
$$R^{1C}_{c1}R^{2C}_{c2}R^{3C}_{c3}Si(OR^{OC})_{(4-c1-c2-c3)} \quad (C-1)$$

wherein, $R^{OC}$ represents a hydrocarbon group having 1 to 6 carbon atoms; $R_{1C}$, $R^{2C}$ and $R^{3C}$ represent a hydrogen atom or an organic group having 1 to 30 carbon atoms; and c1, c2 and c3 represent 0 or 1 and satisfy $1 \leq c1+c2+c3 \leq 3$.

18. The composition for forming a metal oxide-containing film according to claim 17, wherein the component (C) is a silicon-containing compound obtained by hydrolysis and/or condensation of a mixture containing one or more kinds of silicon compounds represented by the general formula (C-1) and one or more kinds of silicon compounds represented by the following general formula (C-2) that are different from the one or more kinds of silicon compounds represented by the general formula (C-1),

$$Si(OR^{4C})_4 \quad (C-2)$$

wherein, $R^{4C}$ represents a hydrocarbon group having 1 to 6 carbon atoms.

19. The composition for forming a metal oxide-containing film according to claim 17, wherein any one or more of $R^{1C}$, $R^{2C}$ and $R^{3C}$ in the general formula (C-1) is an organic group containing a hydroxyl group or a carboxyl group, the groups being substituted with an acid-labile group.

20. The composition for forming a metal oxide-containing film according to claim 1, wherein the composition for forming a metal oxide-containing film further comprises an acid and/or a thermal acid generator.

\* \* \* \* \*